United States Patent
Kobayashi et al.

(10) Patent No.: US 12,336,398 B2
(45) Date of Patent: Jun. 17, 2025

(54) DISPLAY DEVICE WITH A DRIVER CIRCUIT COMPRISING A PLURALITY OF PULSE OUTPUT CIRCUITS

(71) Applicant: Semiconductor Energy Laboratory Co., Ltd., Atsugi (JP)

(72) Inventors: Hidetomo Kobayashi, Isehara (JP); Takayuki Ikeda, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 419 days.

(21) Appl. No.: 17/628,381

(22) PCT Filed: Jul. 21, 2020

(86) PCT No.: PCT/IB2020/056818
§ 371 (c)(1),
(2) Date: Jan. 19, 2022

(87) PCT Pub. No.: WO2021/024063
PCT Pub. Date: Feb. 11, 2021

(65) Prior Publication Data
US 2022/0278187 A1 Sep. 1, 2022

(30) Foreign Application Priority Data
Aug. 2, 2019 (JP) .................................. 2019-142922

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
CPC ... H10K 59/131; H10K 59/1275; H05B 33/02
See application file for complete search history.

(56) References Cited

U.S. PATENT DOCUMENTS

| 7,067,926 B2 | 6/2006 | Yamazaki et al. |
| 7,511,380 B2 | 3/2009 | Yamazaki et al. |

(Continued)

FOREIGN PATENT DOCUMENTS

| CN | 001519929 A | 8/2004 |
| CN | 001615057 A | 5/2005 |

(Continued)

OTHER PUBLICATIONS

International Search Report (Application No. PCT/IB2020/056818), dated Sep. 24, 2020.

(Continued)

*Primary Examiner* — Lex H Malsawma
*Assistant Examiner* — Bruce R. Smith
(74) *Attorney, Agent, or Firm* — Eric J. Robinson; Robinson Intellectual Property Law Office, P.C.

(57) ABSTRACT

A display device with high design flexibility that can be designed easily is provided. One embodiment of the present invention includes a first substrate (101) provided with a driver circuit including first and second pulse output circuits (91_1, 91_2), a second substrate (103) provided with a display unit (92) including a first pixel circuit including a first source wiring (SL_1) and a first contact portion (SC_1) and a second pixel circuit including a second source wiring (SL_2) adjacent to the first source wiring and a second contact portion (SC_2) electrically connected to the second source wiring, and a connection unit where the first and second substrates are electrically connected to each other. The display unit is placed to overlap with the driver circuit, the first and second pulse output circuits are electrically connected to the first and second pixel circuits respectively through the first and second contact portions, the first pulse output circuit is placed on an opposite side of a straight line connecting the first and second contact portions from the (Continued)

second pulse output circuit, and the connection unit includes a wiring containing copper.

6 Claims, 24 Drawing Sheets

(56) References Cited

U.S. PATENT DOCUMENTS

| | | | |
|---|---|---|---|
| 9,760,102 | B2 | 9/2017 | Tanaka et al. |
| 9,798,339 | B2 | 10/2017 | Tanaka et al. |
| 10,365,674 | B2 | 7/2019 | Tanaka et al. |
| 10,586,495 | B2 | 3/2020 | Kobayashi et al. |
| 10,901,442 | B2 | 1/2021 | Tanaka et al. |
| 11,205,387 | B2 | 12/2021 | Kobayashi et al. |
| 2004/0140547 | A1 | 7/2004 | Yamazaki et al. |
| 2005/0116616 | A1 | 6/2005 | Koeda |
| 2017/0352689 | A1 | 12/2017 | Chung |
| 2018/0026218 | A1* | 1/2018 | Kobayashi ............ G09G 3/3266 349/143 |
| 2018/0122298 | A1 | 5/2018 | Lee et al. |
| 2018/0211596 | A1* | 7/2018 | Gu ....................... G09G 3/3233 |
| 2019/0180696 | A1* | 6/2019 | Park .................... G02B 27/0172 |
| 2021/0103307 | A1 | 4/2021 | Tanaka et al. |
| 2021/0383762 | A1 | 12/2021 | Kobayashi et al. |

FOREIGN PATENT DOCUMENTS

| | | |
|---|---|---|
| EP | 1432032 A | 6/2004 |
| JP | 2004-200522 A | 7/2004 |
| JP | 2005-142054 A | 6/2005 |
| JP | 2018-022143 A | 2/2018 |
| JP | 7532376 | 8/2024 |
| KR | 2005-0044264 A | 5/2005 |
| KR | 10-1158831 | 6/2012 |
| TW | 200417033 | 9/2004 |
| WO | WO-2014/069529 | 5/2014 |
| WO | WO-2017/193316 | 11/2017 |

OTHER PUBLICATIONS

Written Opinion (Application No. PCT/IB2020/056818), dated Sep. 24, 2020.

* cited by examiner

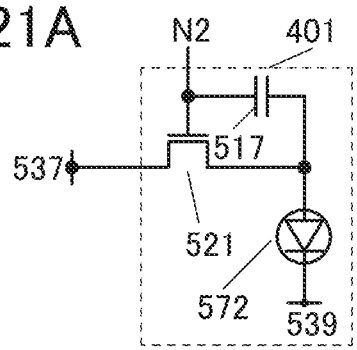
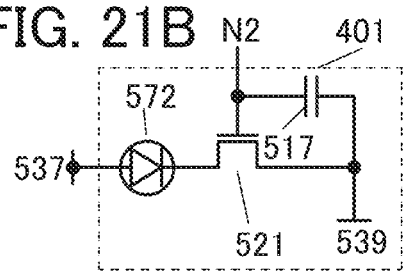
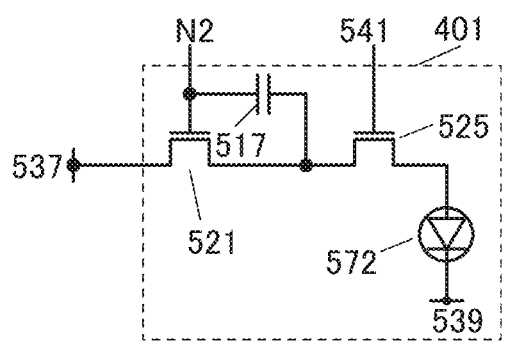
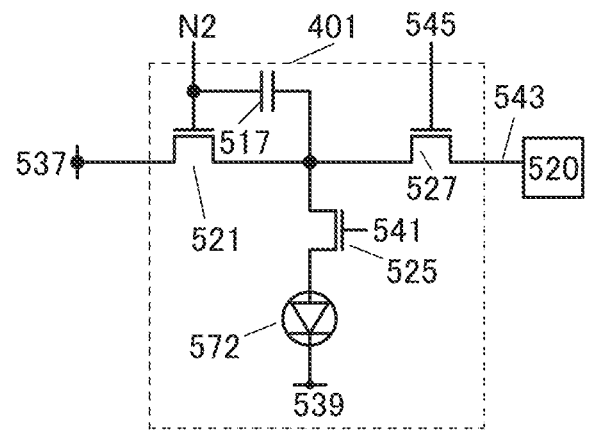
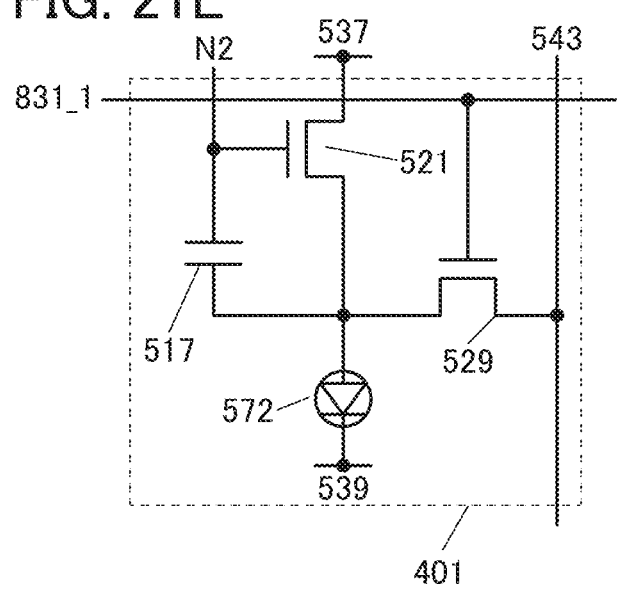

DISPLAY DEVICE WITH A DRIVER CIRCUIT COMPRISING A PLURALITY OF PULSE OUTPUT CIRCUITS

TECHNICAL FIELD

The present invention relates to an object, a method, or a manufacturing method. Alternatively, the present invention relates to a process, a machine, manufacture, or a composition of matter. In particular, one embodiment of the present invention relates to a semiconductor device, a light-emitting apparatus, a display device, an electronic device, a lighting device, a driving method thereof, or a manufacturing method thereof. In particular, one embodiment of the present invention relates to a display device (display panel). Alternatively, one embodiment of the present invention relates to an electronic device, a light-emitting apparatus, or a lighting device that includes a display device, or a manufacturing method thereof.

Note that in this specification and the like, a semiconductor device generally means a device that can function by utilizing semiconductor characteristics. A transistor, a semiconductor circuit, an arithmetic device, a memory device, and the like are each one embodiment of the semiconductor device. Moreover, a light-emitting apparatus, a display device, a lighting device, and an electronic device each include a semiconductor device in some cases.

BACKGROUND ART

A display device such as a liquid crystal display device or an electroluminescence (EL) display device that is used for an electronic device or other devices has been required to have a narrower bezel so as to be reduced in size and designed more freely.

The provision of circuits such as shift registers in a region where pixels are provided (a pixel region) for narrowing a bezel is also proposed. For example, Patent Document 1 discloses a structure where a source driver or a gate driver is provided in a pixel region so as to increase design flexibility.

REFERENCE

Patent Document

[Patent Document 1] PCT International Publication No. 2014-69529

SUMMARY OF THE INVENTION

Problems to be Solved by the Invention

In the structure described in Patent Document 1, for example, gate drivers are dispersedly provided in a pixel region. Thus, the pixel circuit provided with transistors that make up a gate driver makes the area of a pixel larger, as compared with the pixel circuit without transistors that make up a gate driver, which is problematic because it hinders increase of resolution. Furthermore, the presence of two types of pixel circuits makes the circuit design complicated. That is, gate drivers and lead wirings for connecting the pixels also become complicated.

An object of one embodiment of the present invention is to provide a display device with a narrow bezel. Another object is to provide a display device that can improve design and flexibility in device design. Another object is to provide a pixel circuit of a display device with high resolution. Another object is to provide a display device with high flexibility in circuit design. Another object is to provide a display device with low power consumption. Another object is to provide a novel display device. Another object is to provide an electronic device including the above display device (display panel). Another object is to provide a novel electronic device.

Note that the description of these objects does not preclude the existence of other objects. One embodiment of the present invention does not need to achieve all these objects. In addition, objects other than the above will be apparent from the description of the specification and the like, and objects other than the above can be derived from the description of the specification and the like.

Means for Solving the Problems

One embodiment of the present invention includes a first silicon substrate provided with a driver circuit including a first pulse output circuit and a second pulse output circuit, a second silicon substrate provided with a display unit including a first pixel circuit including a first source wiring and a first contact portion electrically connected to the first source wiring and a second pixel circuit including a second source wiring adjacent to the first source wiring and a second contact portion electrically connected to the second source wiring, and a connection unit where the first silicon substrate and the second silicon substrate are electrically connected to each other. The display unit is placed to overlap with the driver circuit, the first pulse output circuit is electrically connected to the first pixel circuit through the first contact portion, the second pulse output circuit is electrically connected to the second pixel circuit through the second contact portion, the first pulse output circuit is placed on an opposite side of a straight line connecting the first contact portion and the second contact portion from the second pulse output circuit, and the connection unit includes a wiring containing copper.

One embodiment of the present invention includes a first silicon substrate provided with a driver circuit including a first pulse output circuit and a second pulse output circuit, a second silicon substrate provided with a display unit including a first pixel circuit including a first source wiring and a first contact portion electrically connected to the first source wiring and a second pixel circuit including a second source wiring adjacent to the first source wiring and a second contact portion electrically connected to the second source wiring, and a connection unit where the first silicon substrate and the second silicon substrate are electrically connected to each other. The display unit is placed to overlap with the driver circuit, the first pulse output circuit is electrically connected to the first pixel circuit through the first contact portion, the second pulse output circuit is electrically connected to the second pixel circuit through the second contact portion, a straight line connecting the first contact portion and the second contact portion is placed to intersect with both the source line and the gate line, and the connection unit includes a conductive bump.

One embodiment of the present invention includes a first silicon substrate provided with a driver circuit including a first pulse output circuit and a second pulse output circuit, a second silicon substrate provided with a display unit including a first pixel circuit including a first source wiring and a first contact portion electrically connected to the first source wiring and a second pixel circuit including a second source wiring adjacent to the first source wiring and a second contact portion electrically connected to the second source wiring, and a connection unit where the first silicon substrate and the second silicon substrate are electrically connected to each other. The display unit is placed to overlap with the driver circuit, the first pulse output circuit is electrically connected to the first pixel circuit through the first contact portion, the second pulse output circuit is electrically connected to the second pixel circuit through the second contact portion, a straight line connecting the first contact portion and the second contact portion is placed to intersect with both the source line and the gate line, and the first silicon substrate is provided with a through-silicon via electrically connected to the pixel circuits.

In one embodiment of the present invention, the first pixel circuit includes a first display element, and the first display element has a function of emitting visible light or a function of transmitting visible light.

In one embodiment of the present invention, a second display element is further included, and the second display element has a function of reflecting visible light.

Note that in this specification, a module in which a connector such as an FPC (Flexible Printed Circuit) or a TCP (Tape Carrier Package) is attached to a display element, a module in which a printed wiring board is provided at the end of a TCP, or a module in which an IC (integrated circuit) is directly mounted by a COG (Chip On Glass) method on a substrate where a display element is formed is also included in a display device in some cases.

Effect of the Invention

According to one embodiment of the present invention, a display device with a narrow bezel can be provided. Alternatively, a display device that can improve design and flexibility in device design can be provided. Alternatively, a display device including a pixel circuit that can increase resolution can be provided. Alternatively, a display device that can prevent circuit design from being complicated can be provided. Alternatively, a display device with low power consumption can be provided. Alternatively, a novel display device can be provided. Alternatively, an electronic device including the above display device (display panel) can be provided. Alternatively, a novel electronic device can be provided.

Note that the description of these effects does not preclude the existence of other effects. One embodiment of the present invention does not have to have all of these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 21A, FIG. 21B, FIG. 21C, FIG. 21D, and FIG. 21E are circuit diagrams each showing a configuration example of a pixel.

MODE FOR CARRYING OUT THE INVENTION

Figure 1A:
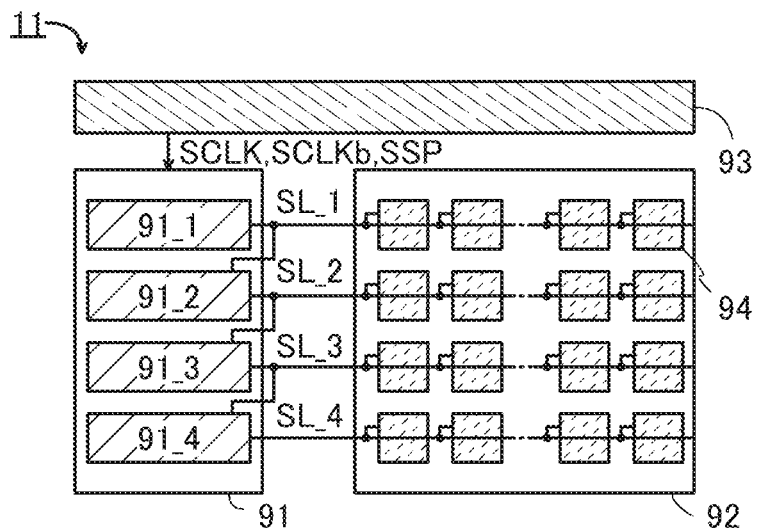
FIG. 1A, FIG. 1B, and FIG. 1C are diagrams illustrating a display device.

Embodiments will be described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of the embodiment below.

Note that in the structures of the invention described below, the same portions or portions having similar functions are denoted by the same reference numerals in different drawings, and description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not necessarily limited to the illustrated scale.

Note that in this specification and the like, the ordinal numbers such as "first" and "second" are used in order to avoid confusion among components and do not limit the number.

Embodiment 1

In a display unit of a display device of one embodiment of the present invention, a layer including transistors that make up pixel circuits and a layer including transistors that make up a driver circuit are stacked. Transistors that make up pixel circuits are provided in an upper layer, and transistors that make up a source driver or a gate driver, which is a driver circuit, are provided in a lower layer.

The source driver or the gate driver, which is generally provided in a bezel portion, is provided in the lower layer in the display unit, whereby improvement in design flexibility such as a narrower bezel can be achieved. In the case where the source driver and the gate driver are provided over the same substrate as the pixel circuits, in particular, there is a high probability that the pitch of an output wiring from the source driver or the gate driver to the pixel circuit is larger than the pitch of a source line or a gate line in a high-definition pixel circuit. Thus, the pitch of the output wiring needed to be adjusted to the pitch of the source line or the gate line in the pixel circuit. When the pixel circuits and the source and gate drivers are formed over different substrates and then bonded to each other, the pitch can be adjusted by a bonding part. That is, a region for adjusting the wiring pitch between a pixel region and a region where the source driver and the gate are placed can also be formed to overlap with the pixel region, which enables a narrower bezel.

In addition, with transistors that make up pixel circuits being placed in the upper layer in the display unit, the upper layer can be designed to have repetition of the same circuit layout; whereby the circuit design can be prevented from becoming complex. Furthermore, since driver circuits are not necessary in a substrate where the pixel circuits are provided, the number of pixel circuits obtained from one-shot exposure region can be increased or a pixel circuit with a large size can be designed.

<Display Device with Stacked-Layer Structure>

A structure of the display device will be described with reference to drawings.

FIG. 1A is a drawing for illustrating a structure of a display device. A display device 11 includes a driver circuit 91, a display unit 92, and a driver circuit 93. The display unit 92 includes a plurality of pixel circuits 94 and display elements. A combination of the pixel circuit 94 and the display element may be referred to as a pixel.

The driver circuit 91 includes a plurality of pulse output circuits. Signals such as a source-side clock signal (SCLK), a source-side inverted clock signal (SCLKb), and a source-side start pulse (SSP) are input to the driver circuit 91 from the driver circuit 93. The driver circuit 91 has a function of a source signal line driver circuit. In FIG. 1A, pulse output circuits 91_1 to 91_4 are shown as examples of the plurality of pulse output circuits. The pulse output circuits 91_1 to 91_4 have a function of a shift register, and have a function of outputting image data through source lines SL_1 to SL_4 to the pixel circuits 94.

The pulse output circuits 91_1 to 91_4 in the driver circuit 91 each include a plurality of transistors. Note that transistors with silicon (hereinafter, Si transistors) are used for the transistors in the driver circuit 91, whereby high-speed operation and a structure with CMOS circuits can be both achieved. It is also possible to form a circuit such as a shift register with transistors having the same conductivity type.

The driver circuit 93 is an integrated circuit having a function of a gate line driver circuit and a display controller. The driver circuit 93 has a function of outputting a gate clock signal and a gate start pulse through gate lines (not illustrated) to the pixel circuits 94.

The pixel circuit 94 is a circuit for controlling voltage or current to be supplied to the display element in accordance with voltage of image data for gray scale display. The display element is an element, which can control gray scale in accordance with voltage or current to be applied to a liquid crystal element or an EL display element.

The pixel circuit 94 includes a plurality of transistors. Note that the transistors included in the pixel circuit are transistors with silicon or transistors having the same conductivity type.

Figure 1B:
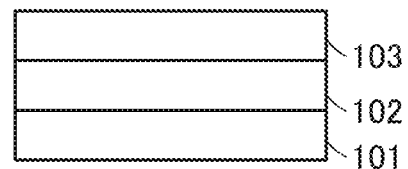

FIG. 1B is a drawing for illustrating the stacked-layer structure of the display device 11 in FIG. 1A. In the display device 11, a substrate 101 including transistors that make up the driver circuit 91, a substrate 103 including transistors that make up the pixel circuits 94 and display elements, and a connection unit 102 that bonds the substrate 101 and the substrate 103 to each other are stacked on one another.

The connection unit 102 is a region where the substrate 101 and the substrate 103 are electrically connected to each other. For the bonding between the substrate 101 and the substrate 103, a method using a conductive bump (hereinafter, bump), a Cu—Cu (copper-copper) direct bonding method, or the like can be used. In the case where a silicon substrate is used as the substrate 103, in particular, a through-silicon via (TSV) may be formed. Although the thickness of the semiconductor substrate is 100 to 300 μm, the thickness may be reduced to be 10 to 100 μm by polishing. The use of the above methods enables the substrate 101 and the substrate 103 to be bonded to each other without the use of a flexible printed circuit (FPC) or the like.

Figure 1C:
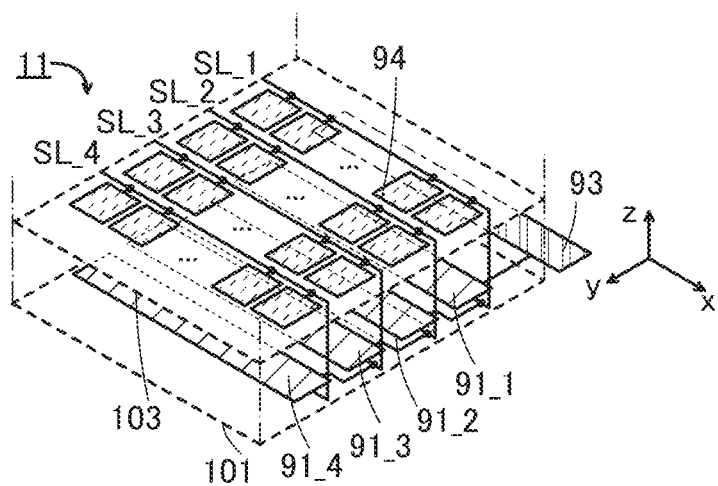

FIG. 1C is a drawing in which the stacked-layer structure in FIG. 1B is reflected in the structure of the display device 11 illustrated in FIG. 1A. In FIG. 1C, the x direction, the y direction, and the z direction are shown. The x direction is parallel to the source lines SL_1 to SL_4 as illustrated in FIG. 1C. The y direction is perpendicular to the x direction. The z direction is perpendicular to a plane defined by the x direction and the y direction.

FIG. 1C shows the substrate 101 including the transistors that make up the driver circuit 91, and the substrate 103 including the transistors that make up the pixel circuits 94 and the display elements. The substrate 101 includes the pulse output circuits 91_1 to 91_4. The substrate 103 includes the pixel circuits 94 and the source lines SL_1 to SL_4. Although the driver circuit 93 is shown in FIG. 1C, the driver circuit 93 may be provided on a substrate different from the substrate 101 and the substrate 103.

As illustrated in FIG. 1A to FIG. 1C, the display device 11 of one embodiment of the present invention has a structure in which the substrate 103 including the transistors that make up the pixel circuits 94 and the display elements, and the substrate 101 including the transistors that make up the driver circuit 91 with the pulse output circuits 91_1 to 91_4 are stacked, in the display unit 92 with the pixel circuits 94.

With this structure, the driver circuit 91 functioning as a source driver or a gate driver, which is generally provided in a bezel portion, is provided in the lower layer in the display unit 92; whereby design flexibility such as a narrower bezel can be achieved. In addition, the transistors that make up the pixel circuits 94 are provided in the upper layer in the display unit 92, so that the upper layer can be designed to have repetition of the pixel circuits 94 having the same circuit layout; whereby the circuit design can be prevented from becoming complex.

Although in FIG. 1A and FIG. 1C the pulse output circuits 91_1 to 91_4 are shown as the pulse output circuits included in the driver circuit 91, a structure with four or more pulse output circuits may be employed.

Figure 2A:
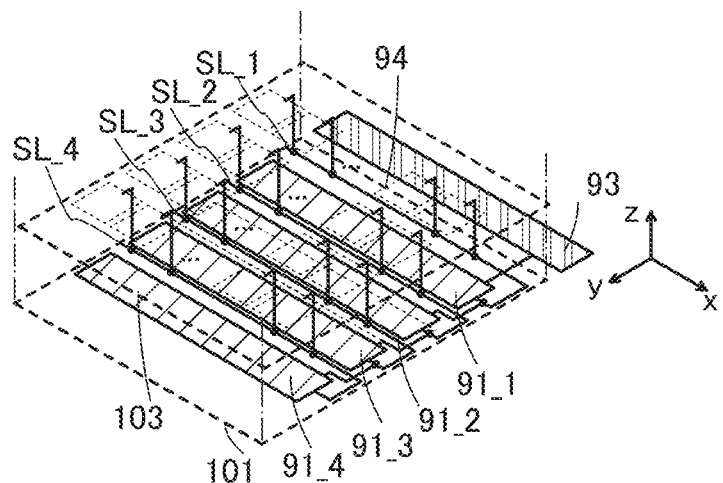
FIG. 2A and FIG. 2B are diagrams each illustrating a display unit.
Figure 2B:
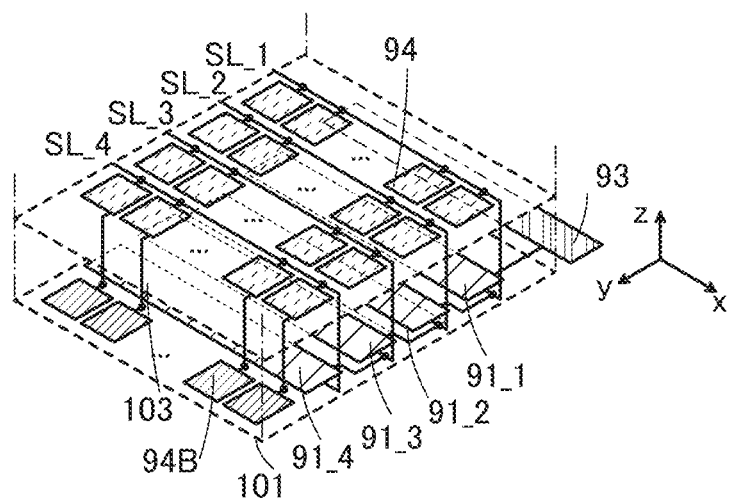

The source lines SL_1 to SL_4 may be placed in the substrate 101 as shown in FIG. 2A, although they are provided in the substrate 103 in FIG. 1C. Circuits 94B, which are some of the pixel circuits, may be provided in the substrate 101 as shown in FIG. 2B, although the pixel circuits 94 are provided in the substrate 103 in FIG. 1C.

As described above, in the display unit of the display device of one embodiment of the present invention, a layer including transistors that make up pixel circuits and a layer including transistors that make up a driver circuit are stacked. Transistors that make up pixel circuits are provided in an upper layer, and transistors that make up a gate driver, which is a driver circuit, are provided in a lower layer. The gate driver, which is generally provided in a bezel portion, is provided in the lower layer in the display unit; whereby improvement in design flexibility such as a narrower bezel can be achieved. In addition, transistors that make up pixel circuits are provided in the upper layer in the display unit, so that the upper layer can be designed to have repetition of the same circuit layout; whereby the circuit design can be prevented from becoming complex.

Here, the substrate 101, the substrate 103, and the connection unit 102 in the case where the substrate 101 and the substrate 103 are bonded to each other will be described with reference to FIG. 3 and FIG. 4.

Figure 3A:
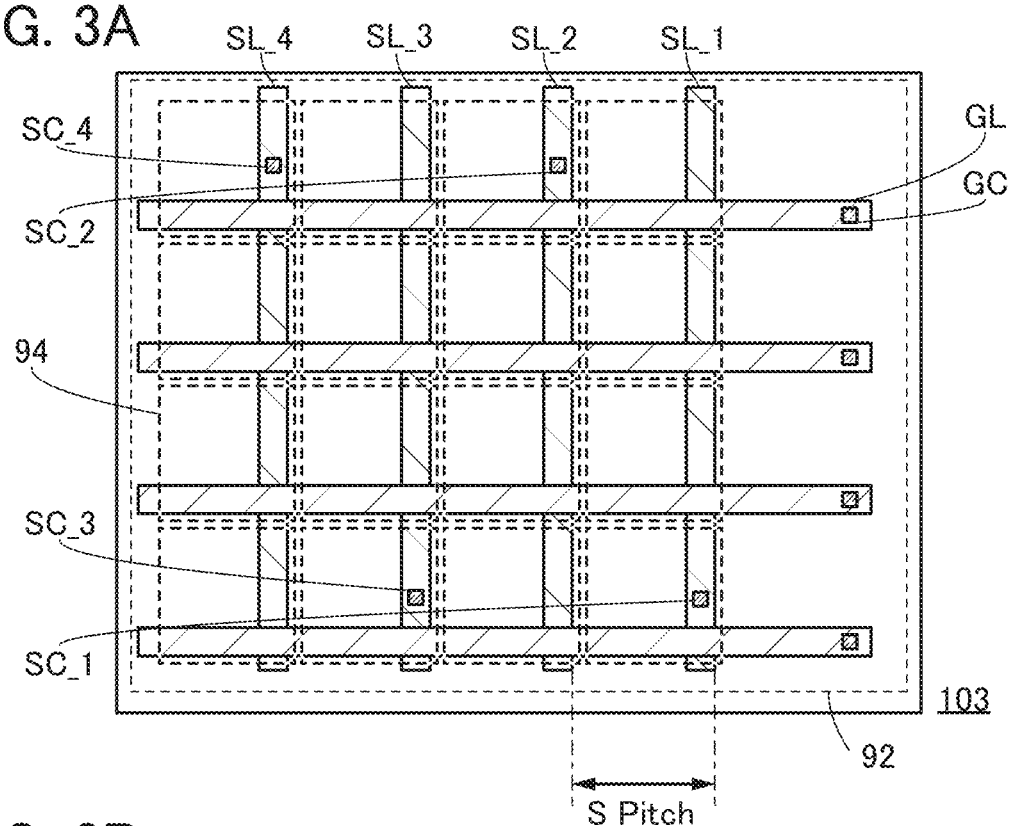
FIG. 3A and FIG. 3B are diagrams each illustrating a display unit.
Figure 3B:
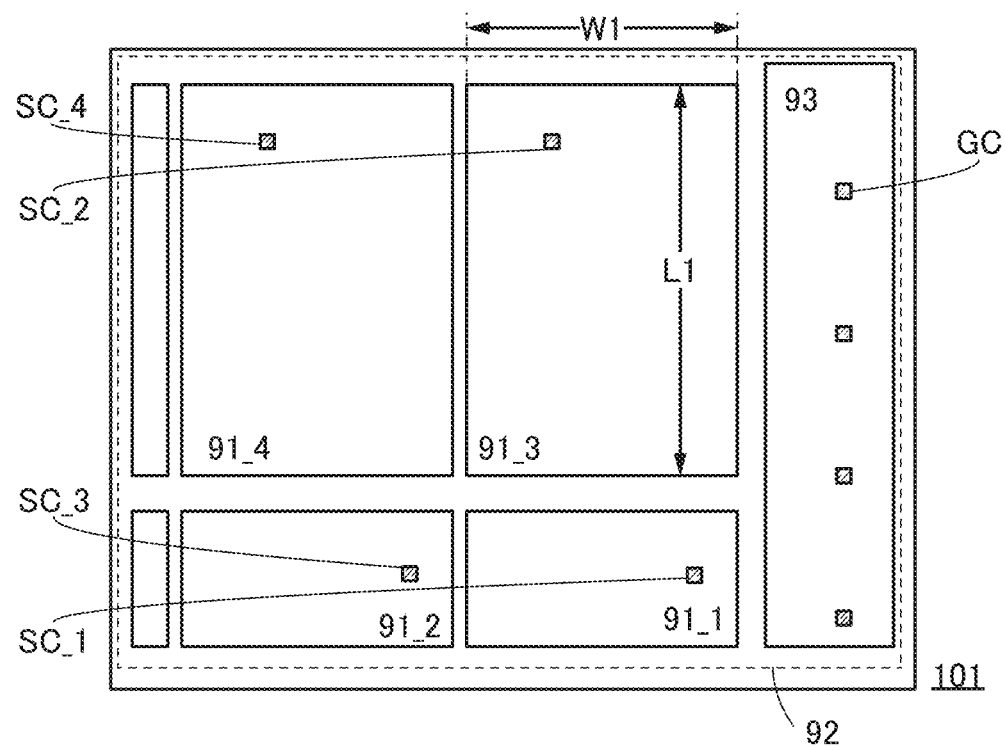
Figure 4A:
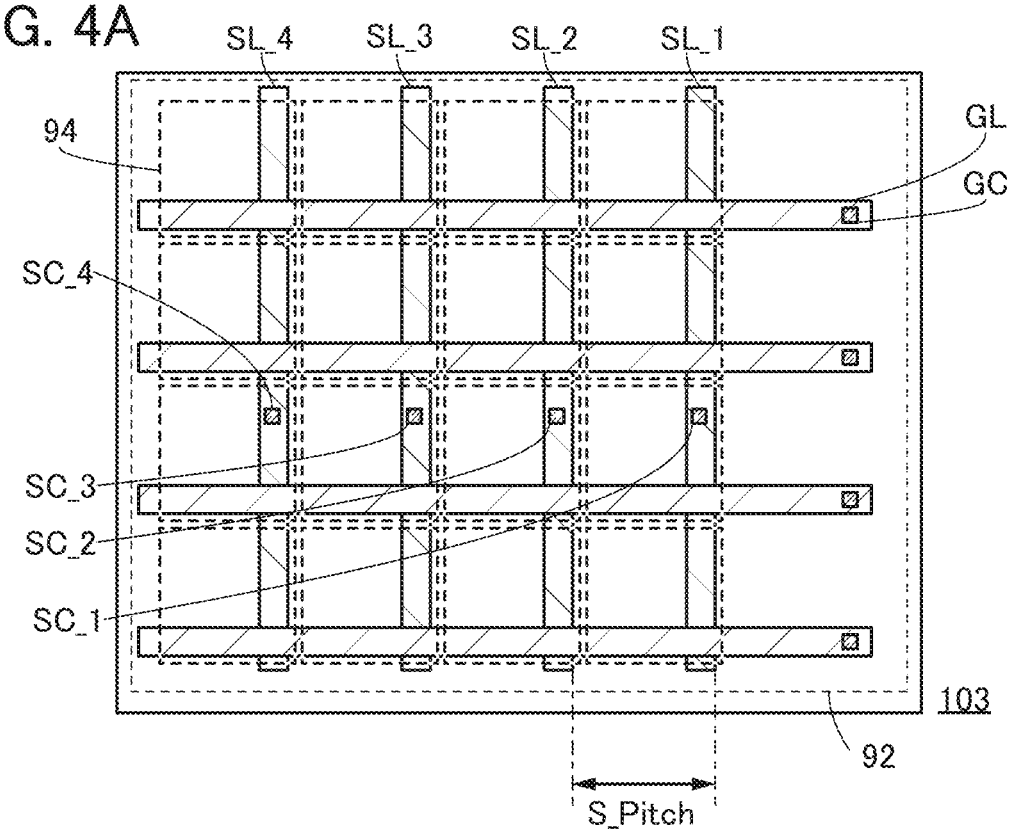
FIG. 4A and FIG. 4B are diagrams each illustrating a display unit.
Figure 4B:
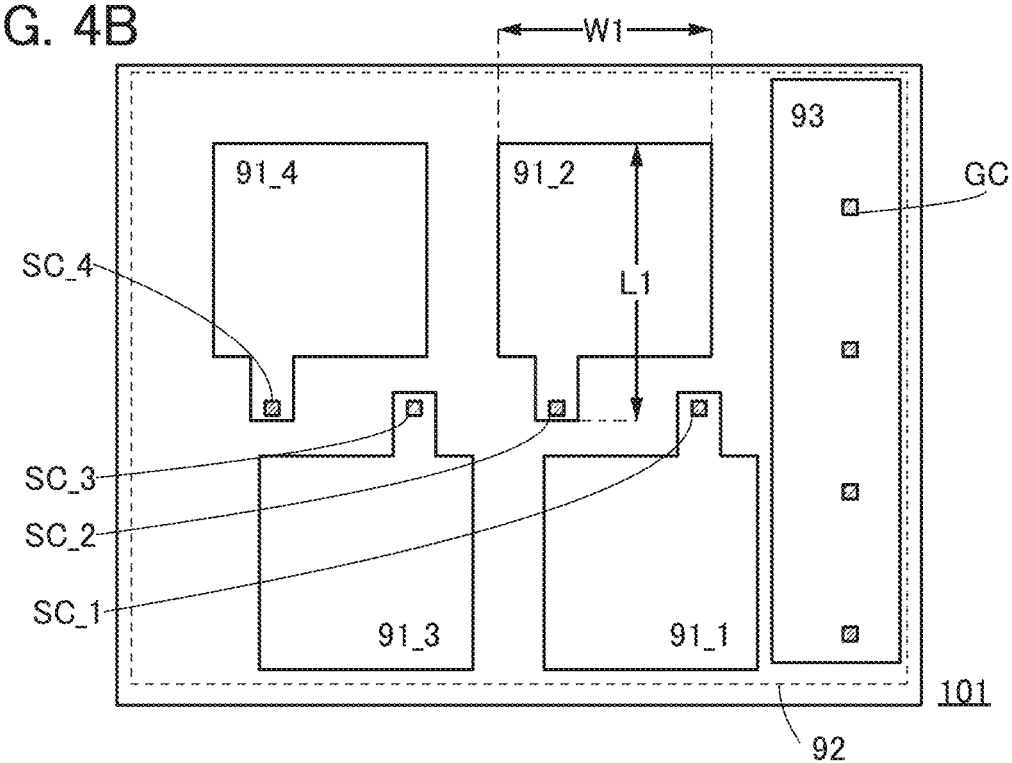

FIG. 3A and FIG. 4A are each a layout example of the display unit 92 provided over the substrate 103. FIG. 3B and FIG. 4B are each a layout example of the driver circuit 91 and the driver circuit 93 placed in a region of the substrate 101 overlapping with the display unit 92 shown in FIG. 3A and FIG. 4A.

As shown in FIG. 3 and FIG. 4, the source lines SL_1 to SL_4 are electrically connected to the pulse output circuits 91_1 to 91_4 through contact portions SC_1 to SC_4. A gate line GL is also electrically connected to the driver circuit 93 through a contact portion GC.

The pulse output circuit 91_1 can be provided to overlap with the plurality of pixel circuits 94.

Specifically, as shown in FIG. 3A and FIG. 4A, an interval between the source line SL_1 and the source line SL_2 adjacent to the source line SL_1, i.e., a wiring interval of the source lines SL is referred to as S_Pitch. When the width of each pulse output circuit in the direction parallel to the source line is (W1) and the length of each pulse output circuit in the direction parallel to the gate line is (L1), design that satisfies S_Pitch<W1<L1 is possible.

Furthermore, as shown in FIG. 3, it is preferable that the contact portion SC_1 that is provided for electrically connected to the source line SL_1 and the contact portion SC_2 that is provided for electrically connected to the source line SL_2 placed near the source line S1_1 be placed such that a straight line through the contact portion SC_1 and the contact portion SC_2 intersects with both the source line and the gate line. Such layout enables the design margin between contacts to be wide.

As shown in FIG. 4A and FIG. 4B, the pulse output circuits 91_1 to 91_4 may be formed alternately with respect to a straight line through the contact portion SC_1 and the contact portion SC_2 placed nearest to the contact portion SC_1.

Note that in the layout shown in FIG. 4, the contact portions SC_1 to SC_4 electrically connected to the source lines SL_1 to SL_4 can be placed at the middles of respective source lines, which can reduce wiring resistance.

Although a straight line connecting the contact portions is parallel to the gate line in FIG. 4, one embodiment of the present invention is not limited to this layout. For example, the contact portions may be placed, in a region with a certain width around the middles of the source lines, such that a straight line connecting the contact portion SC_1 and the contact portion SC_2 and a straight line connecting the contact portion SC_1 and the contact portion SC_4 intersect with the gate line, and a straight line connecting the contact portion SC_1 and the contact portion SC_3 is parallel to the gate line.

Design flexibility of the driver circuit 91 can be increased with the display unit 92 and the driver circuit 91 overlapping with each other and with the layout that satisfies the following formula: the wiring interval of the source line SL in a pixel circuit region (S_Pitch)<the width of one pulse output circuit driving the pixel circuit in the direction parallel to the source line (W1)<the length of one pulse output circuit driving the pixel circuit in the direction parallel to the gate line (L1).

Structure Example of Display Device

Components of the display device will be described below.

Figure 5:
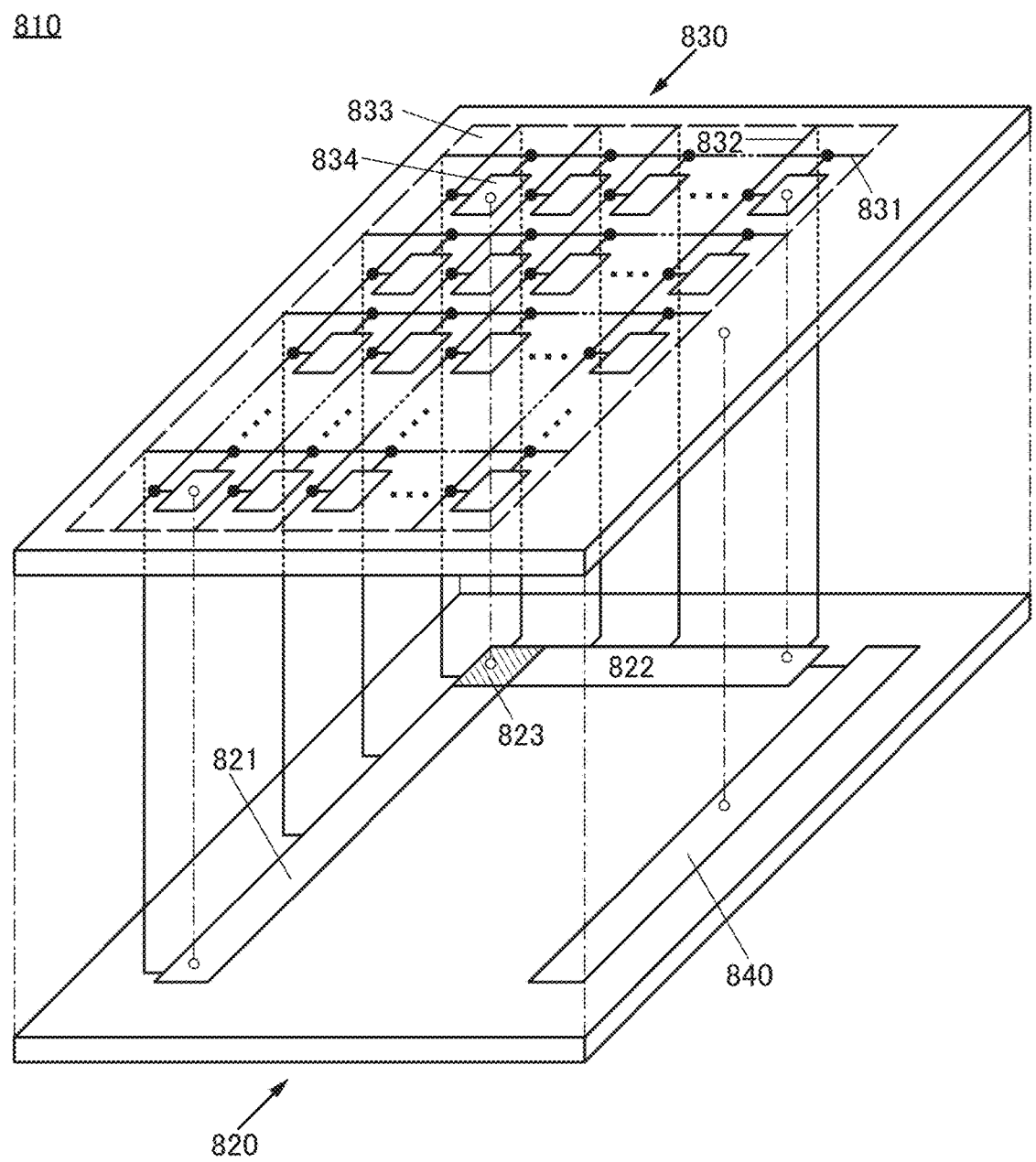
FIG. 5 is a diagram showing a structure example of a display device.

FIG. 5 is a diagram showing a structure example of a display device 810 of one embodiment of the present invention. The display device 810 includes a layer 820 and a layer 830 stacked over the layer 820. The layer 820 includes a gate driver circuit 821, a source driver circuit 822, and a circuit 840. The layer 830 includes pixels 834, and the pixels 834 are arranged in a matrix to form a pixel array 833. An interlayer insulator can be provided between the layer 820 and the layer 830. Note that the layer 820 may be stacked over the layer 830.

The circuit 840 is electrically connected to the source driver circuit 822. Note that the circuit 840 may be electrically connected to another circuit or the like.

The pixels 834 in the same row are electrically connected to the gate driver circuit 821 through a wiring 831, and the pixels 834 in the same column are electrically connected to the source driver circuit 822 through a wiring 832. The wiring 831 functions as a scan line, and the wiring 832 functions as a data line.

Although FIG. 5 illustrates the structure in which the pixels 834 in one row are electrically connected through one wiring 831 and the pixels 834 in one column are electrically connected through one wiring 832, one embodiment of the present invention is not limited thereto. For example, the pixels 834 in one row may be electrically connected through two or more wirings 831, or the pixels 834 in one column may be electrically connected through two or more wirings 832. That is, for example, one pixel 834 may be electrically connected to two or more scan lines or two or more data lines. Alternatively, for example, one wiring 831 may be electrically connected to the pixels 834 in two or more rows, or one wiring 832 may be electrically connected to the pixels 834 in two or more columns. That is, for example, one wiring 831 may be shared by the pixels 834 in two or more rows, or one wiring 832 may be shared by the pixels 834 in two or more columns.

The gate driver circuit 821 has a function of generating a signal for controlling the operation of the pixel 834 and supplying the signal to the pixel 834 through the wiring 831. The source driver circuit 822 has a function of generating an image signal and supplying the signal to the pixel 834 through the wiring 832. The circuit 840 has a function of receiving image data that serves as a base for an image signal generated by the source driver circuit 822 and supplying the received image data to the source driver circuit 822, for example. The circuit 840 also has a function of a control circuit that generates a start pulse signal, a clock signal, and the like. In addition, the circuit 840 can have a function that the gate driver circuit 821 and the source driver circuit 822 do not have.

The pixel array 833 has a function of displaying an image corresponding to image signals supplied to the pixels 834 from the source driver circuit 822. Specifically, light with luminance corresponding to the image signals is emitted from the pixels 834, whereby an image is displayed on the pixel array 833.

In FIG. 5, the positional relation between the layer 820 and the layer 830 is represented by dashed-dotted lines and blank circles; the blank circle of the layer 820 and the blank circle of the layer 830 that are connected by the dashed-dotted line overlap with each other. Note that the same representation is used in other diagrams.

In the display device 810, the gate driver circuit 821 and the source driver circuit 822, which are provided in the layer 820, each include a region overlapping with the pixel array 833. For example, the gate driver circuit 821 and the source driver circuit 822 each include a region overlapping with some of the pixels 834. Stacking the gate driver circuit 821 and the source driver circuit 822 with the pixel array 833 to have an overlap region allows the display device 810 to have a narrower frame and a smaller size.

The gate driver circuit 821 and the source driver circuit 822 have an overlap region where they are not strictly separated from each other. The region is referred to as a region 823. With the region 823, the area occupied by the gate driver circuit 821 and the source driver circuit 822 can be reduced. Accordingly, even when the area of the pixel array 833 is small, the gate driver circuit 821 and the source driver circuit 822 can be provided without extending beyond the pixel array 833. Alternatively, the area of the region where the gate driver circuit 821 and the source driver circuit 822 do not overlap with the pixel array 833 can be reduced. In the above manner, the frame and size can be further reduced, compared to the structure without the region 823.

The circuit 840 can be provided not to overlap with the pixel array 833. Note that the circuit 840 may be provided to have a region overlapping with the pixel array 833.

Figure 6:
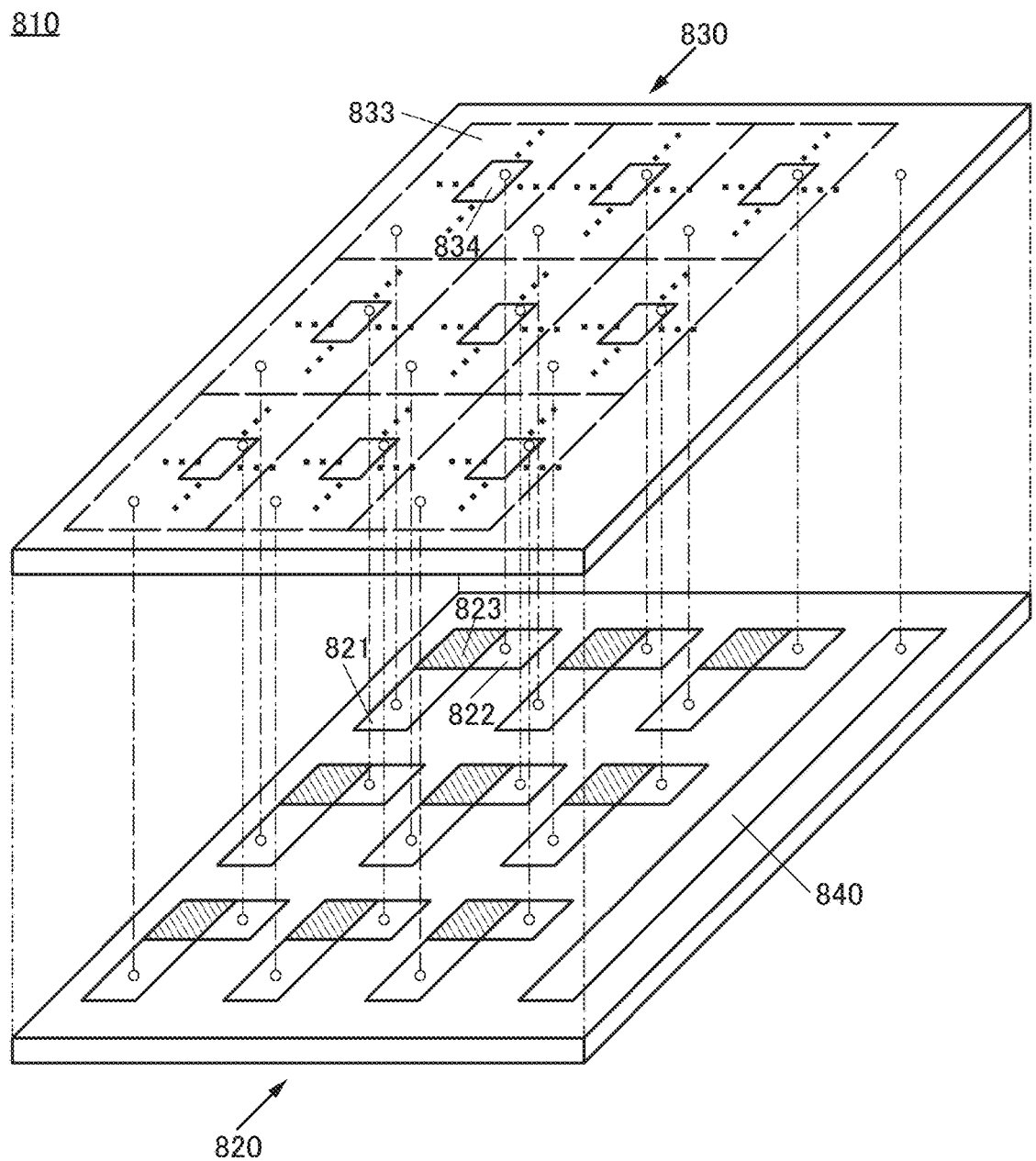
FIG. 6 is a diagram showing a structure example of a display device.

Although FIG. 5 illustrates a structure example in which one gate driver circuit 821 and one source driver circuit 822 are provided in the layer 820 and one pixel array 833 is provided in the layer 830, a plurality of pixel arrays 833 may be provided in the layer 830. That is, the pixel array provided in the layer 830 may be divided. FIG. 6 illustrates a variation example of the structure in FIG. 5, and shows a structure example of the display device 810 in which pixel arrays 833 of three rows by three columns are provided in the layer 830. Note that the layer 830 may include pixel arrays 833 of two rows by two columns, or pixel arrays 833 of four or more rows by four or more columns. The number of rows and the number of columns of pixel arrays 833 provided in the layer 830 may be different from each other. In the display device 810 having the structure illustrated in FIG. 6, one image can be displayed using all the pixel arrays 833, for example.

Although the wiring 831 and the wiring 832 are omitted for simplicity in FIG. 6, the wiring 831 and the wiring 832 are actually provided in the display device 810 having the structure illustrated in FIG. 6. In addition, although the electrical connection relation of the circuit 840 is not illustrated in FIG. 6, the circuit 840 is actually electrically connected to the source driver circuit 822. Note that as in FIG. 6, some components may be omitted in other diagrams.

In the layer 820, the gate driver circuits 821 as many as the pixel arrays 833 and the source driver circuits 822 as many as the pixel arrays 833 can be provided, for example. In that case, each of the gate driver circuits 821 can be provided to overlap with the corresponding pixel array 833 including the pixel 834 to which the gate driver circuit 821 supplies a signal. Moreover, each of the source driver circuits 822 can be provided to overlap with the corresponding pixel array 833 including the pixel 834 to which the source driver circuit 822 supplies an image signal.

When a plurality of pixel arrays 833 are provided and a plurality of gate driver circuits 821 and source driver circuits 822 are provided accordingly, the number of pixels 834 provided in one pixel array 833 can be reduced. A plurality of gate driver circuits 821 can be operated in parallel and a plurality of source driver circuits 822 can be operated in parallel; hence, the time required for writing image signals corresponding to a one-frame image to the pixels 834 can be shortened, for example. Thus, the length of one frame period can be shortened, and the display device 810 can operate at higher speed. Therefore, the number of pixels 834 included in the display device 810 can be increased, resulting in a higher definition of the display device 810. In addition, the definition of an image that can be displayed by the display device of one embodiment of the present invention can be higher than the definition of an image that can be displayed by a display device in which a gate driver circuit and a source driver circuit do not overlap with a pixel array. Furthermore, the clock frequency can be lowered, so that power consumption of the display device 810 can be reduced.

With a structure where a gate driver circuit and a source driver circuit do not overlap with a pixel array, the gate driver circuit and the source driver circuit are provided in a portion around the pixel array, for example. In this case, it is difficult to provide pixel arrays of more than two rows and more than two columns in terms of positions where source driver circuits would be provided, for example. In contrast, in the display device 810, the gate driver circuit and the source driver circuit can be provided in a layer different from the layer including the pixel array, thereby having a region overlapping with the pixel array; hence, pixel arrays of more than two rows and more than two columns can be provided as illustrated in FIG. 6. In other words, five or more gate driver circuits and five or more source driver circuits can be provided in the display device 810.

As described above, the display device 810 can operate at higher speed, for example, than a display device in which a gate driver circuit and a source driver circuit do not overlap with a pixel array. Thus, the definition of the display device 810 can be higher than that of the display device in which the gate driver circuit and the source driver circuit do not overlap with the pixel array. For example, the pixel density of the display device 810 can be 1000 ppi or higher, 5000 ppi or higher, or 10000 ppi or higher. Consequently, the display device 810 can display high-quality images with little graininess and highly realistic images.

The resolution of an image that can be displayed by the display device 810 can be higher than that of an image that can be displayed by the display device in which the gate driver circuit and the source driver circuit do not overlap with the pixel array. For example, the display device 810 can display images with a resolution of 4K2K, 8K4K, or higher.

Note that even in the structure where a plurality of source driver circuits 822 and the like are provided in the layer 820 and a plurality of pixel arrays 833 are provided in the layer 830, the number of circuits 840 provided in the display device 810 can be one as in the structure illustrated FIG. 5. As illustrated in FIG. 6, the circuit 840 can be provided not to overlap with any of the pixel arrays 833. Note that the circuit 840 may be provided to have a region overlapping with any of the pixel arrays 833.

Figure 7:
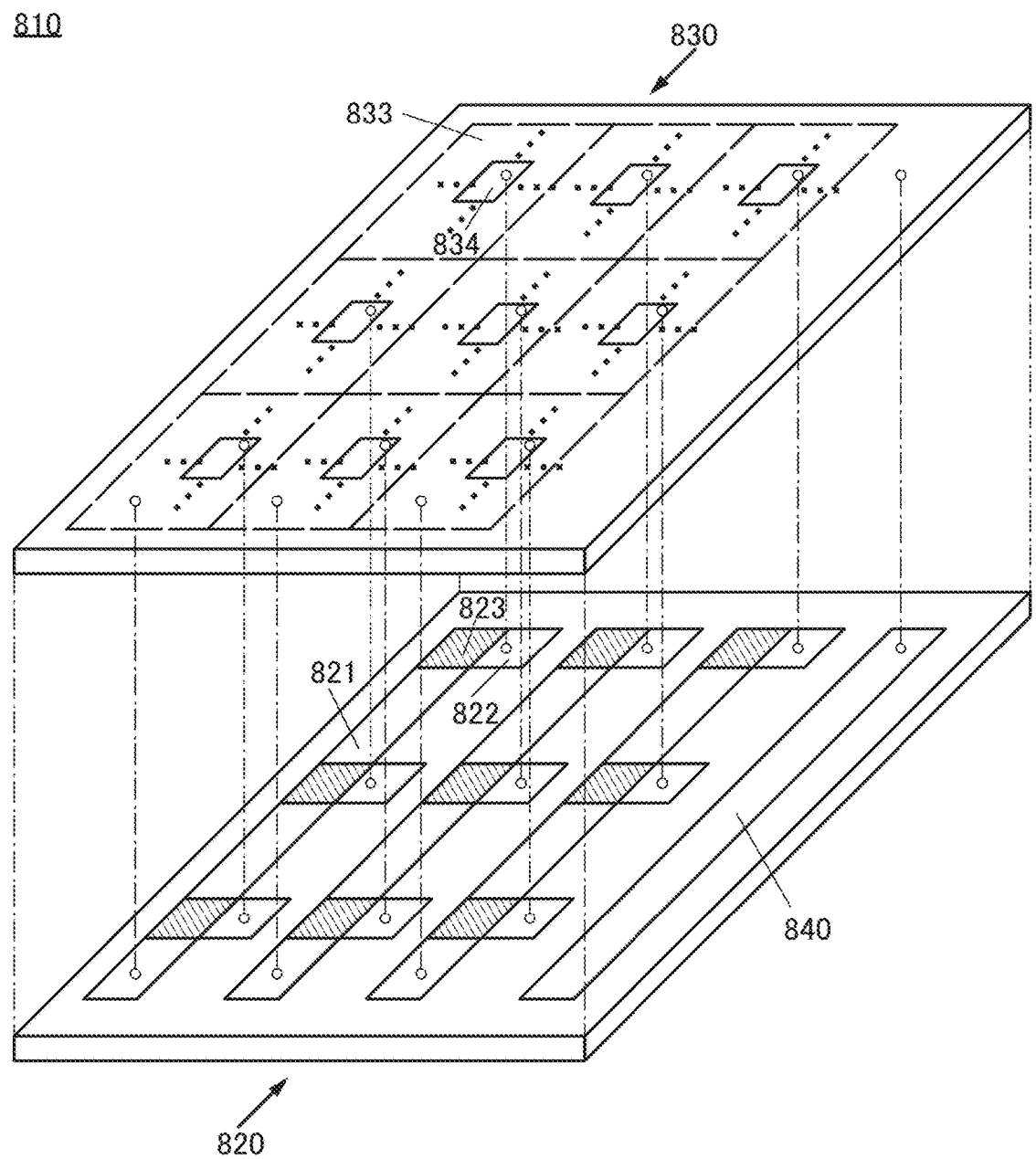
FIG. 7 is a diagram showing a structure example of a display device.

Although FIG. 6 illustrates the structure example in which the number of gate driver circuits 821 is the same as the number of pixel arrays 833, one embodiment of the present invention is not limited thereto. FIG. 7 illustrates a variation example of the structure in FIG. 6, and shows a structure example of the display device 810 in which the number of gate driver circuits 821 is the same as the number of columns of the pixel arrays 833. In the display device 810 with the structure illustrated in FIG. 7, three gate driver circuits 821 are provided to correspond to pixel arrays 833 of three columns. In addition, pixel arrays 833 of three rows are provided, and the pixel arrays 833 of three rows and one column share one gate driver circuit 821.

Figure 8:
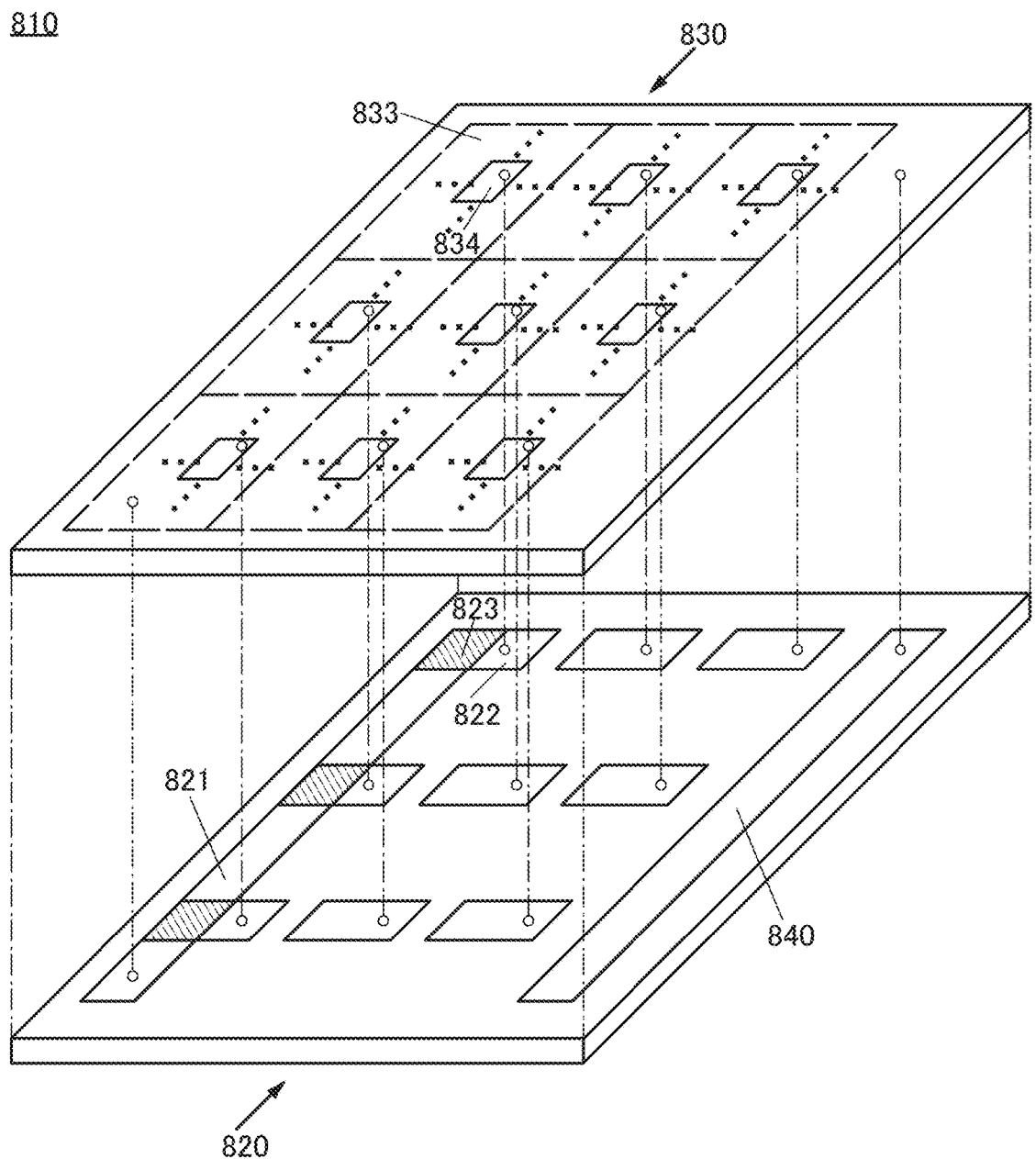
FIG. 8 is a diagram showing a structure example of a display device.

FIG. 8 illustrates a variation example of the structure in FIG. 6, and shows a structure example of the display device 810 including a plurality of pixel arrays 833 and one gate driver circuit 821. In the display device 810 with the structure illustrated in FIG. 8, pixel arrays 833 of three rows and three columns share one gate driver circuit 821. Note that in the display device 810 with the structure in FIG. 8, the gate driver circuit 821 can be provided not to overlap with the pixel array 833.

Although not illustrated, the number of source driver circuits 822 is not necessarily the same as the number of pixel arrays 833. The number of source driver circuits 822 in the display device 810 may be larger than or smaller than the number of pixel arrays 833 in the display device 810.

Figure 9:
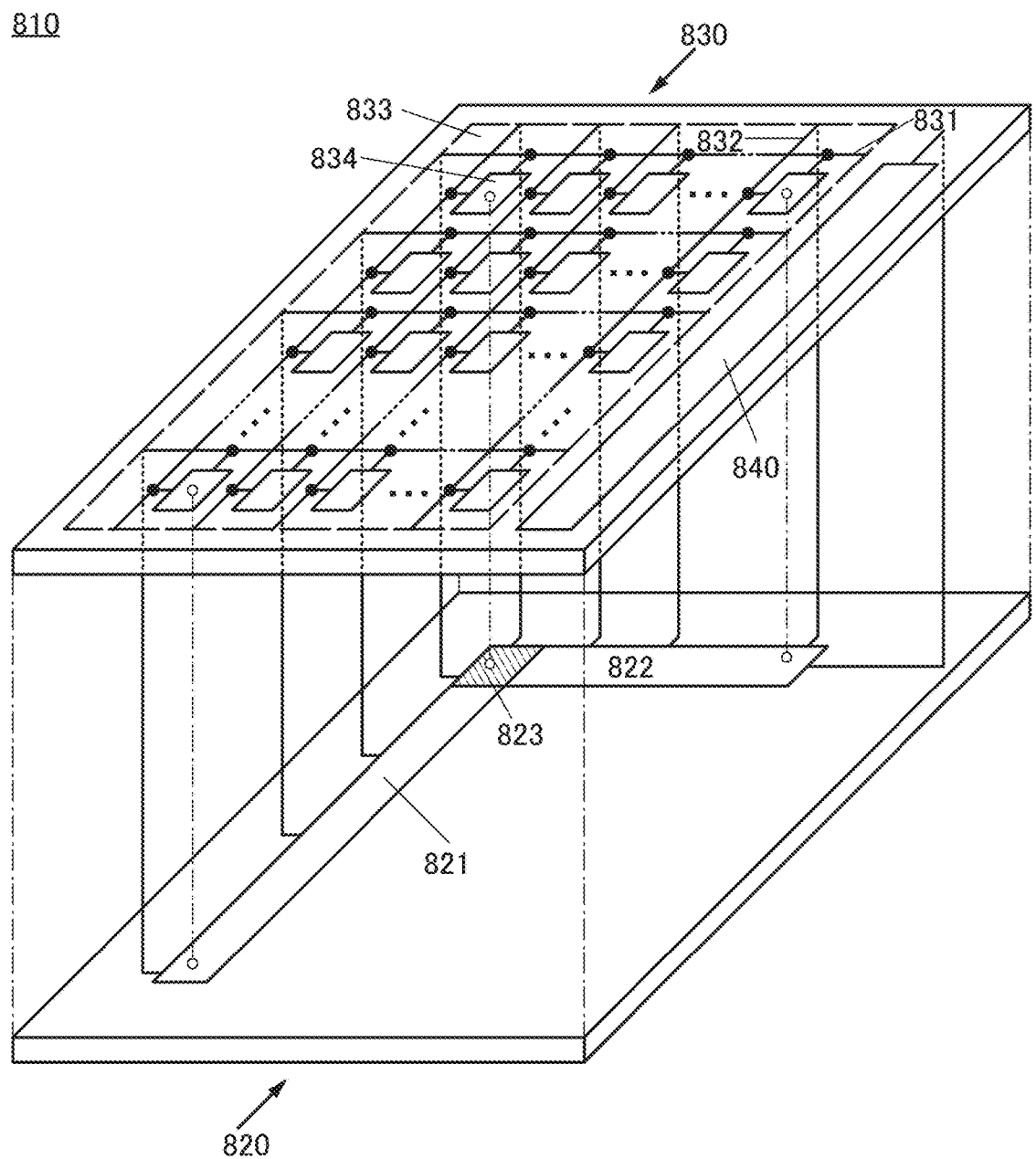
FIG. 9 is a diagram showing a structure example of a display device.

Although FIG. 5 illustrates the structure example in which the circuit 840 is provided in the layer 820, the circuit 840 is not necessarily provided in the layer 820. FIG. 9 illustrates a variation example of the structure in FIG. 5 and shows a structure example of the display device 810 in which the circuit 840 is provided in the layer 830. Note that the components of the circuit 840 may be provided in both the layer 820 and the layer 830.

Figure 10:
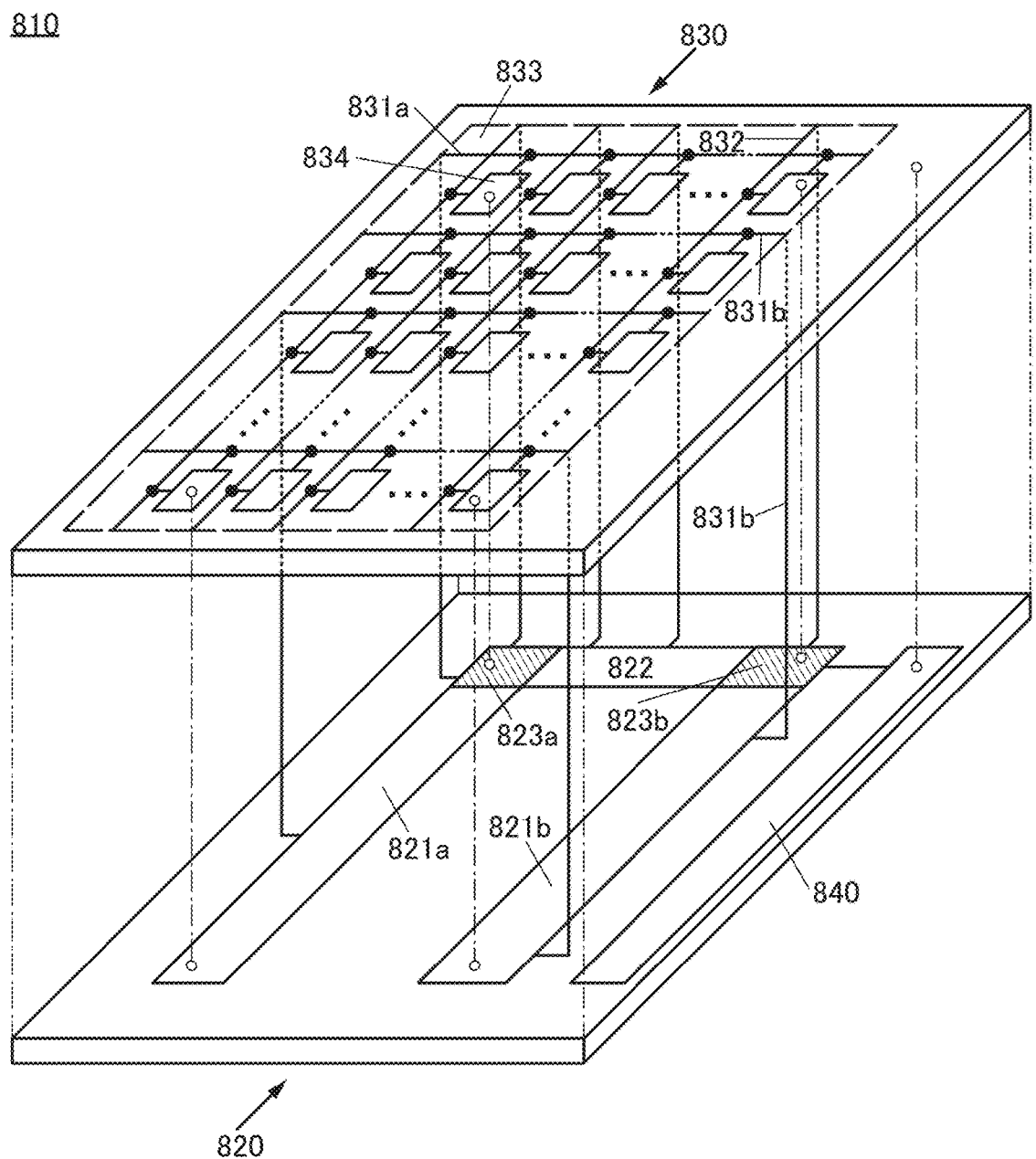
FIG. 10 is a diagram showing a structure example of a display device.

Although FIG. 5 illustrates the structure example including one pixel array 833 and one gate driver circuit, the number of gate driver circuits may be larger than that of pixel arrays 833. FIG. 10 illustrates a variation example of the structure in FIG. 5, and shows a structure example of the display device 810 in which two gate driver circuits (a gate driver circuit 821*a* and a gate driver circuit 821*b*) are provided for one pixel array 833.

In the display device 810 having the structure illustrated in FIG. 10, the pixels 834 in an odd-numbered row are electrically connected to the gate driver circuit 821*a* through a wiring 831*a*, and the pixels 834 in an even-numbered row are electrically connected to the gate driver circuit 821*b* through a wiring 831*b*. The wiring 831*a* and the wiring 831*b* function as scan lines like the wiring 831.

The gate driver circuit 821*a* has a function of generating a signal for controlling the operation of the pixel 834 in the odd-numbered row and supplying the signal to the pixel 834 through the wiring 831*a*. The gate driver circuit 821*b* has a function of generating a signal for controlling the operation of the pixel 834 in the even-numbered row and supplying the signal to the pixel 834 through the wiring 831*b*.

Like the gate driver circuit 821, each of the gate driver circuit 821*a* and the gate driver circuit 821*b* includes a region overlapping with the pixel array 833. For example, each of the gate driver circuit 821*a* and the gate driver circuit 821*b* includes a region overlapping with the pixels 834, like the gate driver circuit 821. The gate driver circuit 821*a* includes a region 823*a* where the gate driver circuit 821*a* overlaps with the source driver circuit 822 without being strictly separated from the source driver circuit 822. The gate driver circuit 821*b* includes a region 823*b* where the gate driver circuit 821*b* overlaps with the source driver circuit 822 without being strictly separated from the source driver circuit 822.

In the display device 810 having the structure illustrated in FIG. 10, the gate driver circuit 821*a* can operate to write image signals to all the pixels 834 in the odd-numbered rows, and then the gate driver circuit 821*b* can operate to write image signals to all the pixels 834 in the even-numbered rows. That is, the display device 810 having the structure illustrated in FIG. 10 can operate by an interlace method. With an interlace method, the operating speed of the display device 810 can be increased and the frame frequency can be increased. In addition, the number of pixels 834 to which image signals are written in one frame period can be half that when the display device 810 operates by a progressive method. Thus, in the display device 810, the clock frequency can be lower in interlace driving than in progressive driving; hence, power consumption of the display device 810 can be reduced.

Figure 11:
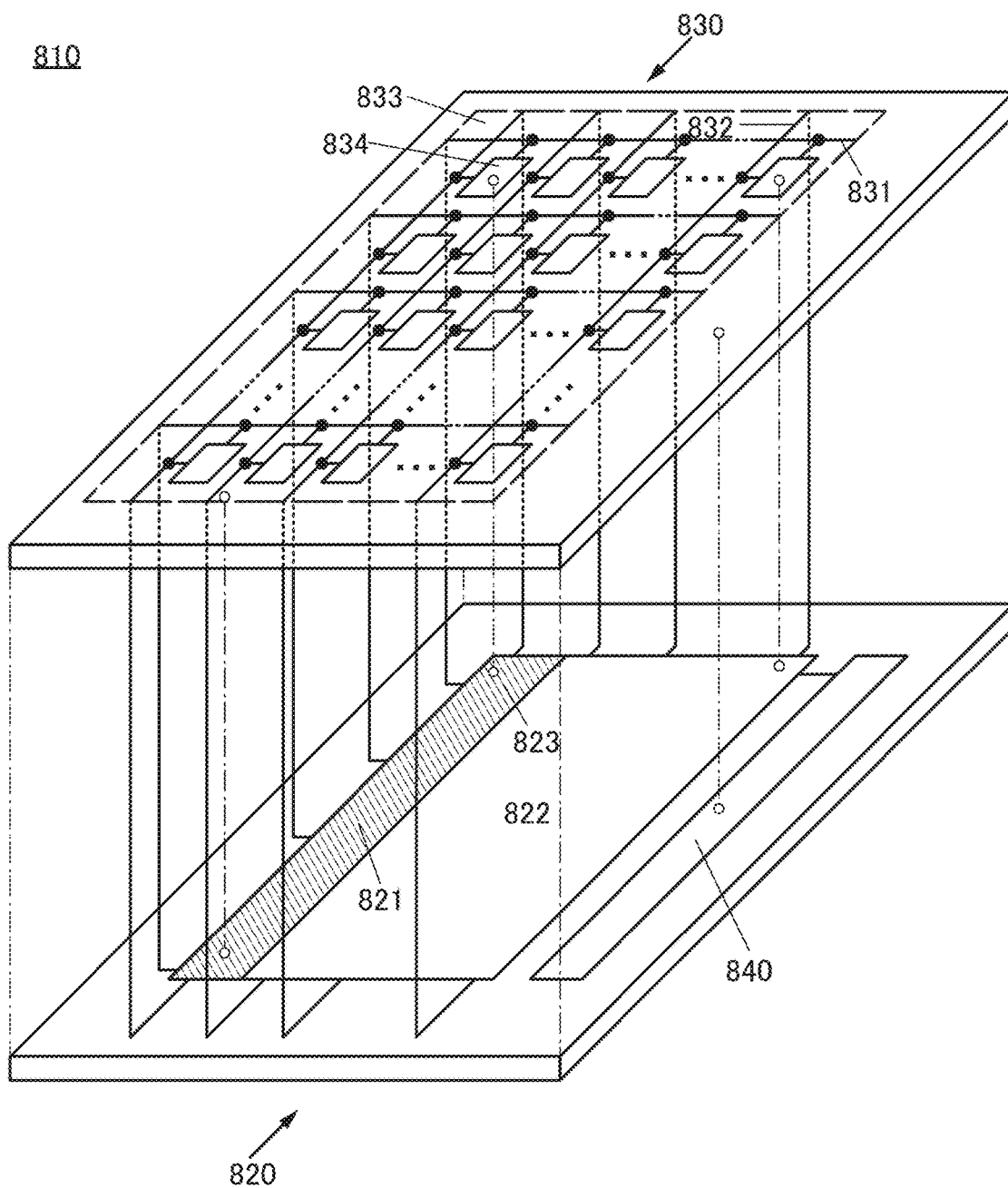
FIG. 11 is a diagram showing a structure example of a display device.

Although FIG. 5 illustrates the structure example in which only one end of the wiring 832 is connected to the source driver circuit 822, a plurality of portions of the wiring 832 may be connected to the source driver circuit 822. FIG. 11 illustrates a structure example of the display device 810 in which the source driver circuit 822 is connected to both ends of the wiring 832. When a plurality of portions of the wiring 832 are connected to the source driver circuit 822, signal delay due to wiring resistance, parasitic capacitance, and the like can be inhibited, for example. This increases the operating speed of the display device 810.

Note that not only both ends of the wirings 832 but also another portion of the wiring 832 may be connected to the source driver circuit 822. For example, a center portion of the wiring 832 may be connected to the source driver circuit 822. By increasing the number of portions where the wiring 832 and the source driver circuit 822 are connected, signal delay and the like can be further inhibited and the operating speed of the display device 810 can be further increased. Alternatively, for example, a structure may be employed in which one end of the wiring 832 and a center portion of the wiring 832 are connected to the source driver circuit 822 and the other end of the wiring 832 is not connected to the source driver circuit 822.

When one source driver circuit 822 is connected to a plurality of portions of the wiring 832, the area occupied by the source driver circuit 822 increases as illustrated in FIG. 11. Even in that case, the source driver circuit 822 is stacked to have a region overlapping with the pixel array 833, which can inhibit an increase in size of the display device 810. FIG. 11 shows that the entire gate driver circuit 821 overlaps with the source driver circuit 822 without being strictly separated from the source driver circuit 822; however, even when one source driver circuit 822 is connected to a plurality of portions of the wiring 832, only part of the gate driver circuit 821 may overlap with the source driver circuit 822.

Note that a plurality of portions of the wiring 831 may be connected to one gate driver circuit 821; thus, signal delay or the like can be inhibited, and the operating speed of the display device 810 can be increased. Such a structure increases the area occupied by the gate driver circuit 821 as in the case of employing the source driver circuit 822 in FIG. 11; however, the gate driver circuit 821 is stacked to have a region overlapping with the pixel array 833, which can prevent an increase in size of the display device 810.

The structures of the display device 810 that are illustrated in FIGS. 5 to 11 can be combined as appropriate. For example, the structure in FIG. 6 can be combined with the structure in FIG. 10. In this case, the display device 810 can include, for example, a plurality of pixel arrays 833, gate driver circuits twice as many as the pixel arrays 833, and source driver circuits 822 as many as the pixel arrays 833.

Structure Example of Circuit 840 and Source Driver Circuit 822

Figure 12:
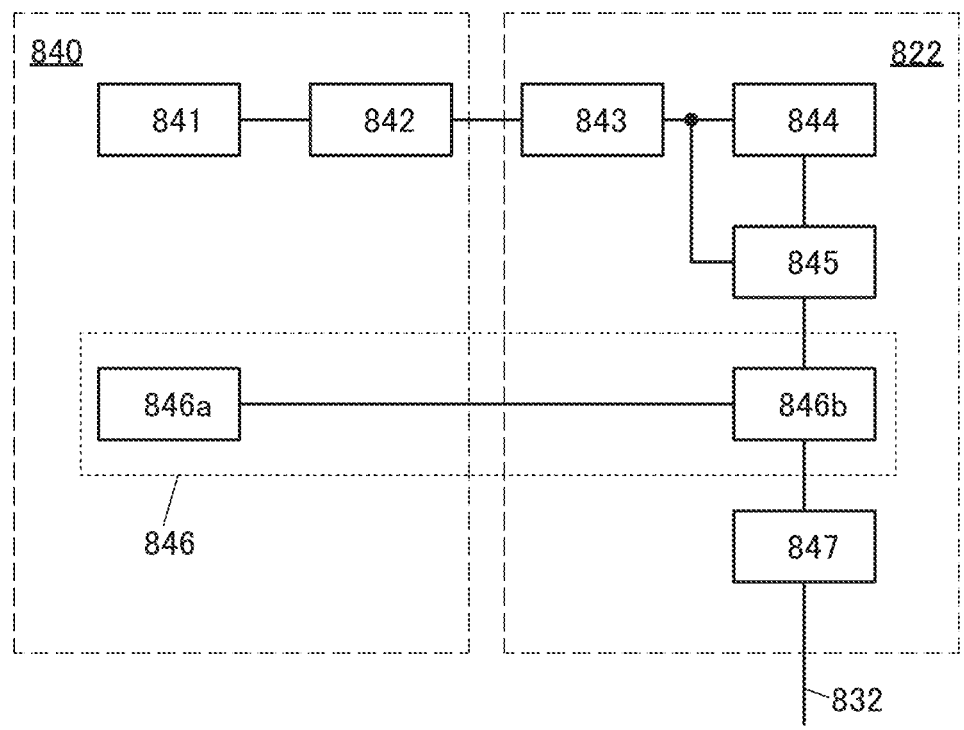
FIG. 12 is a block diagram showing a structure example of a display device.

FIG. 12 is a block diagram illustrating a structure example of the circuit 840 and the source driver circuit 822. Although FIG. 12 illustrates only one source driver circuit 822, the circuit 840 can be electrically connected to a plurality of source driver circuits 822.

The circuit 840 includes a receiver circuit 841, a serial-to-parallel converter circuit 842, and a potential generator circuit 846a. The source driver circuit 822 includes a buffer circuit 843, a shift register circuit 844, a latch circuit 845, a pass transistor logic circuit 846b, and an amplifier circuit 847. Here, the potential generator circuit 846a and the pass transistor logic circuit 846b constitute a digital-to-analog converter circuit (hereinafter D/A converter circuit) 844.

The receiver circuit 841 is electrically connected to the serial-to-parallel converter circuit 842. The serial-to-parallel converter circuit 842 is electrically connected to the buffer circuit 843. The buffer circuit 843 is electrically connected to the shift register circuit 844 and the latch circuit 845. The shift register circuit 844 is electrically connected to the latch circuit 845. The latch circuit 845 and the potential generator circuit 846a are electrically connected to the pass transistor logic circuit 846b. The pass transistor logic circuit 846b is electrically connected to an input terminal of the amplifier circuit 847. An output terminal of the amplifier circuit 847 is electrically connected to the wiring 832.

The receiver circuit 841 has a function of receiving image data that serves as a base for an image signal generated by the source driver circuit 822. The image data can be single-ended image data. When the receiver circuit 841 receives image data with the use of a data transmitting signal based on low voltage differential signaling (LVDS) or the like, the receiver circuit 841 may have a function of converting the received signal into a signal based on a standard that can undergo internal processing.

The serial-to-parallel converter circuit 842 has a function of performing parallel conversion of single-ended image data output from the receiver circuit 841. Providing the serial-to-parallel converter circuit 842 in the circuit 840 allows image data and the like to be transmitted from the circuit 840 to the source driver circuit 822 and the like, even if a load at the time when image data and the like are transmitted from the circuit 840 to the source driver circuit 822 and the like is large.

The buffer circuit 843 can be a unity gain buffer, for example. The buffer circuit 843 has a function of outputting data identical to image data output from the serial-to-parallel converter circuit 842. With the buffer circuit 843 provided in the source driver circuit 822, even if a potential corresponding to image data output from the serial-to-parallel converter circuit 842 is lowered by wiring resistance or the like when being transmitted from the circuit 840 to the source driver circuit 822, a potential corresponding to the decrease amount can be recovered. Accordingly, the decrease in driving capability of the source driver circuit 822 and the like can be inhibited even if the load is large at the time of transmitting image data and the like from the circuit 840 to the source driver circuit 822 and the like.

The shift register circuit 844 has a function of generating a signal for controlling the operation of the latch circuit 845. The latch circuit 845 has a function of holding or outputting image data output from the buffer circuit 843. Whether the latch circuit 845 holds or outputs image data is selected in accordance with a signal supplied from the shift register circuit 844.

The D/A converter circuit 846 has a function of converting digital image data, which is output from the latch circuit 845, into an analog image signal. The potential generator circuit 846a has a function of generating potentials that correspond to the number of bits of image data capable of being subjected to D/A conversion and supplying the potentials to the pass transistor logic circuit 846b. For example, when the D/A converter circuit 846 has a function of converting 8-bit image data into an analog image signal, the potential generator circuit 846a can generate 256 potentials with different levels.

The pass transistor logic circuit 846b has a function of receiving image data from the latch circuit 845 and outputting any of the potentials generated by the potential generator circuit 846a on the basis of the digital value of the received image data. For example, a potential output from the pass transistor logic circuit 846b can be higher as the digital value of image data is higher. The potential output from the pass transistor logic circuit 846b can be used as an image signal.

As illustrated in FIG. 12, in the display device 810, the circuits constituting the D/A converter circuit 846 can be provided in both the source driver circuit 822 and the circuit 840. Specifically, a circuit that is preferably provided in each source driver circuit (e.g., the pass transistor logic circuit 846b) can be provided in the source driver circuit 822, and a circuit that is not necessarily provided in each source driver circuit (e.g., the potential generator circuit 846a) can be provided in the circuit 840. In that case, the area occupied by the source driver circuit 822 can be reduced as compared with the case where all circuits constituting the D/A converter circuit 846 are provided in the source driver circuit 822, for example; hence, the number of source driver circuits 822 provided in the layer 820 can be increased. Thus, the number of pixel arrays 833 provided in the layer 830 can be increased, and it is possible to achieve high speed operation, low power consumption, and high definition of the display device 810, for example, as well as high resolution of images that the display device 810 can display. Here, the components of a circuit other than the D/A converter circuit 846 can also be provided in both the source driver circuit 822 and the circuit 840.

When the circuits constituting the D/A converter circuit 846 are provided in both the source driver circuit 822 and the circuit 840 as illustrated in FIG. 12, the display device 810 can include one potential generator circuit 846a and pass transistor logic circuits 846b as many as the source driver circuits 822.

The amplifier circuit 847 has a function of amplifying an image signal output from the pass transistor logic circuit 846b and outputting the amplified signal to the wiring 832 functioning as a data line. Providing the amplifier circuit 847 allows an image signal to be supplied to the pixel 834 stably. As the amplifier circuit 847, a voltage follower circuit including an operational amplifier and the like can be used, for example. Note that in the case where a circuit including a differential input circuit is used as the amplifier circuit, the offset voltage of the differential input circuit is preferably set as close to 0 V as possible.

In the circuit 840, a variety of circuits can be provided in addition to the receiver circuit 841, the serial-to-parallel converter circuit 842, and the potential generator circuit 846a. For example, the circuit 840 can include a control circuit having a function of generating a start pulse signal, a clock signal, and the like.

Configuration Example of D/A Converter Circuit 846

Figure 13:
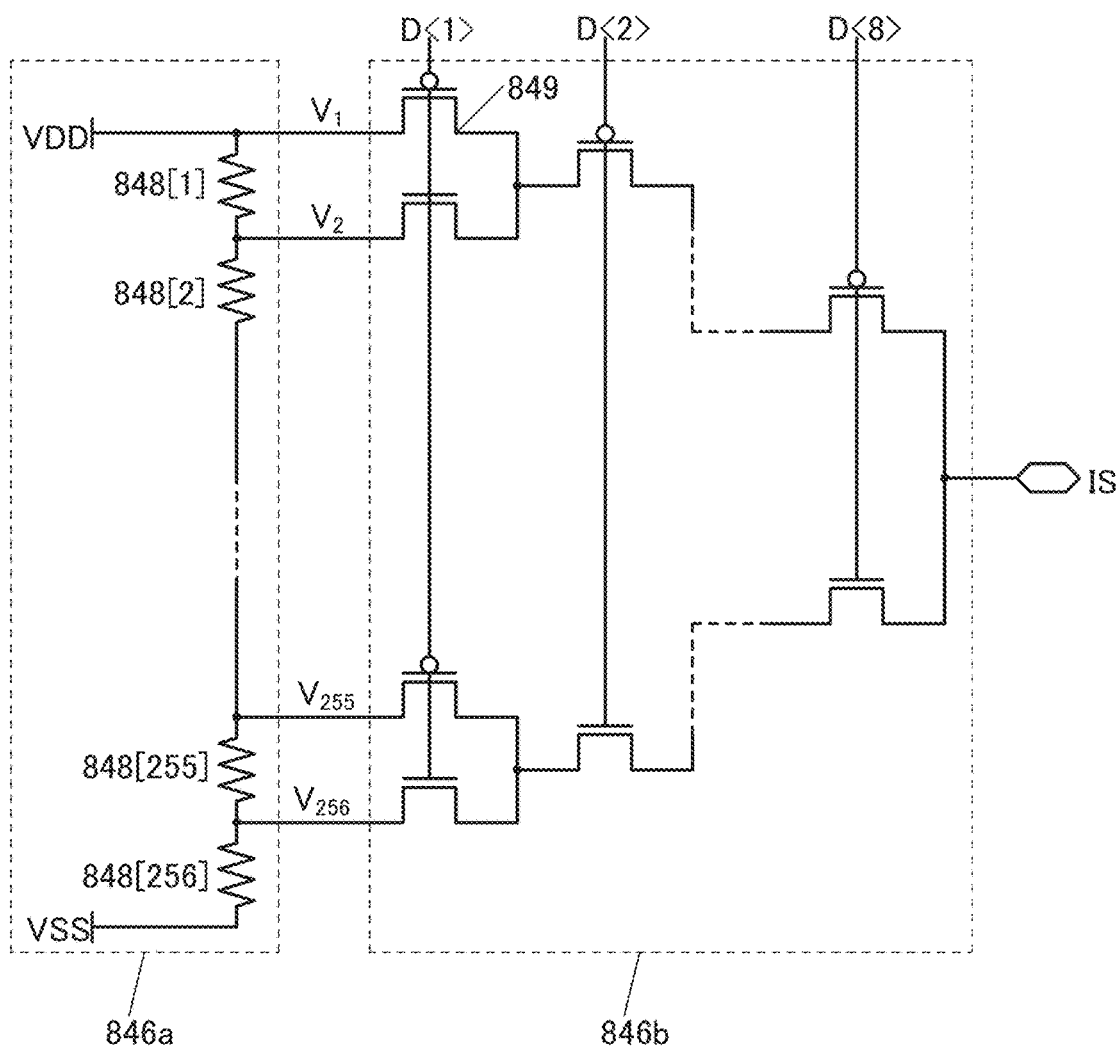
FIG. 13 is a circuit diagram showing a configuration example of a D/A converter circuit.

FIG. 13 is a circuit diagram illustrating a configuration example of the potential generator circuit 846a and the pass transistor logic circuit 846b, which constitute the D/A converter circuit 846. The D/A converter circuit 846 having the configuration illustrated in FIG. 13 is capable of converting 8-bit image data D<1> to D<8> into an analog image signal IS.

In this specification and the like, for example, first-bit image data D is denoted as the image data D<1>, second-bit image data D is denoted as the image data D<2>, and eighth-bit image data D is denoted as the image data D<8>.

The potential generator circuit 846a having the configuration in FIG. 13 includes a resistor 848[1] to a resistor 848[256] that are connected in series. In other words, the D/A converter circuit 846 can be a resistor-string D/A converter circuit.

A potential VDD can be supplied to one terminal of the resistor 848[1]. A potential VSS can be supplied to one terminal of the resistor 848[256]. Thus, potentials $V_1$ to $V_{256}$ that have different levels can be output from the terminals of the resistors 848[1] to 848[256]. Although FIG. 13 illustrates a configuration example of the potential generator circuit 846a in which the potential $V_1$ is the potential VDD, the potential $V_{256}$ may be the potential VSS. Alternatively, the potential $V_1$ may be the potential VDD and the potential $V_{256}$ may be the potential VSS without providing the resistor 848[256].

In this specification and the like, the potential VDD can be a high potential and the potential VSS can be a low potential, for example. Here, the low potential can be a ground potential, for example. The high potential is a potential higher than the low potential, and can be a positive potential when the low potential is a ground potential.

The pass transistor logic circuit 846b having the configuration in FIG. 13 is formed of 8-stage pass transistors 849. Specifically, the pass transistor logic circuit 846b has a structure in which one stage is separated into two electrical paths; i.e., the pass transistor logic circuit 846b has a total of 256 paths. That is, the pass transistors 849 can be regarded as being electrically connected in a tournament manner. The analog image signal IS can be output from one of a source and a drain of the pass transistor 849 in the eighth stage, which is the last stage.

For example, the image data D<1> can be supplied to the pass transistor 849 in the first stage, the image data D<2> can be supplied to the pass transistors 849 in the second stage, and the image data D<8> can be supplied to the pass transistors 849 in the eighth stage. In this manner, the potential of the image signal IS can be set to any of the potential $V_1$ to the potential $V_{256}$ in accordance with the image data D. Consequently, digital image data can be converted into the analog image signal IS.

The pass transistor logic circuit 846b in FIG. 13 includes n-channel pass transistors 849 and p-channel pass transistors 849; alternatively, the pass transistor logic circuit 846b can include only n-channel pass transistors 849. The pass transistors 849 provided in the pass transistor logic circuit 846b can be all n-channel transistors when the image data D<1> to the image data D<8> and their complementary data are supplied to the gates of the pass transistors 849, for example.

The configuration illustrated in FIG. 13 can also be applied to the D/A converter circuit 846 having a function of performing D/A conversion on the image data D with bits other than 8 bits. For example, when 1024 or 1023 resistors 848 are provided in the potential generator circuit 846a and 10-stage pass transistors 849 are provided in the pass transistor logic circuit 846b, the D/A converter circuit 846 can have a function of performing D/A conversion on 10-bit image data D.

Configuration Example of Gate Driver Circuit 821

Figure 14:
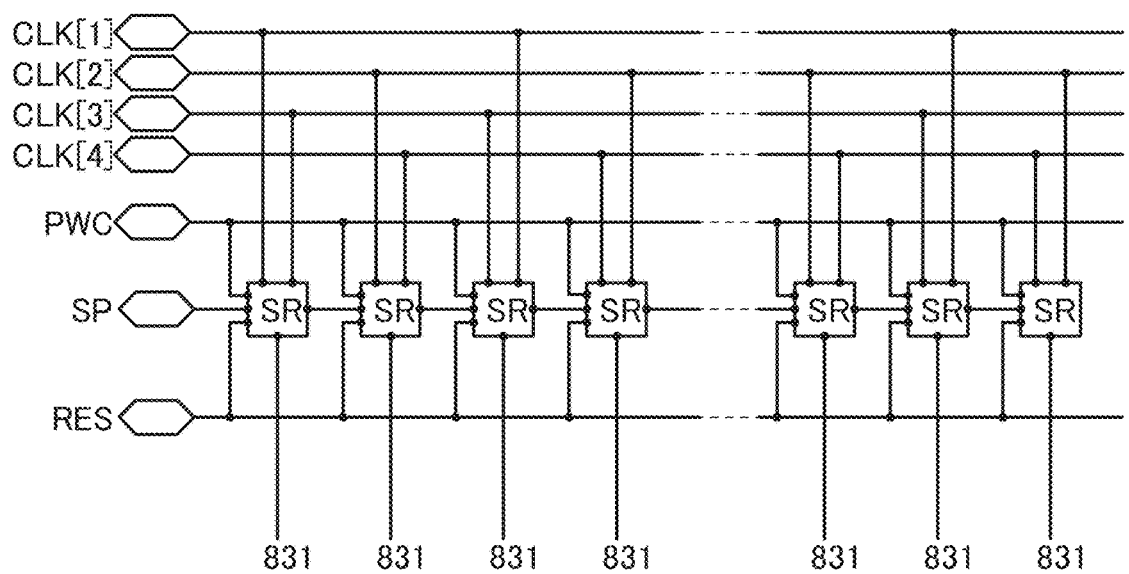
FIG. 14 is a block diagram showing a configuration example of a shift register.

FIG. 14 is a block diagram illustrating a configuration example of the gate driver circuit 821. The gate driver circuit 821 includes shift register circuits SR composed of a plurality of set-reset flip-flops. The shift register circuit SR is electrically connected to the wiring 831 having a function of a scan line, and has a function of outputting a signal to the wiring 831.

A signal RES is reset signal. When the signal RES is set to a high potential, for example, all the outputs of the shift register circuits SR can be a low potential. A signal SP is a start pulse signal. When the signal SP is input to the gate driver circuit 821, the shift operation of the shift register circuits SR can be started. A signal PWC is a pulse width control signal and has a function of controlling the pulse width of a signal output from the shift register circuit SR to the wiring 831. A signal CLK[1], a signal CLK[2], a signal CLK[3], and a signal CLK[4] are clock signals. For example, two of the signals CLK[1] to CLK[4] can be input to one shift register circuit SR.

Note that the configuration illustrated in FIG. 14 can be applied to the shift register circuit 844 included in the source driver circuit 822 when the wiring 831 electrically connected to the shift register circuit SR is replaced with another wiring, for example.

Figure 15A:
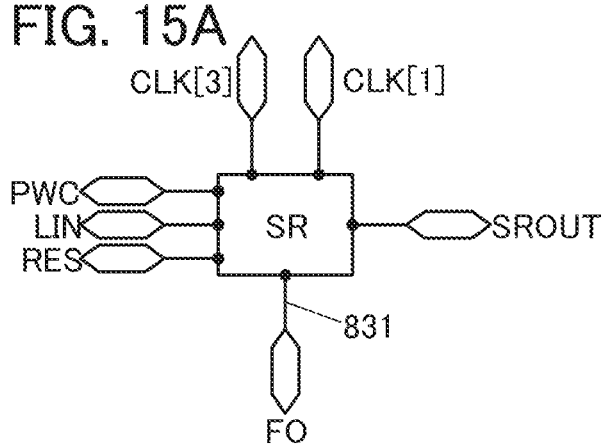
FIG. 15A is a block diagram showing a configuration example of a shift register.

FIG. 15A illustrates signals input to the shift register circuit SR and signals output from the shift register circuit SR. Here, FIG. 15A illustrates the case where the signal CLK[1] and the signal CLK[3] are input as the clock signals.

A signal FO is an output signal and is output to the wiring 831, for example. A signal SROUT is a shift signal and can be used as a signal LIN that is input to the next-stage shift register circuit SR. Among the signals illustrated in FIG. 15A, the signal RES, the signal PWC, the signal CLK[1], the signal CLK[3], and the signal LIN are input to the shift register circuit SR; the signal FO and the signal SROUT are output from the shift register circuit SR.

Figure 15B:
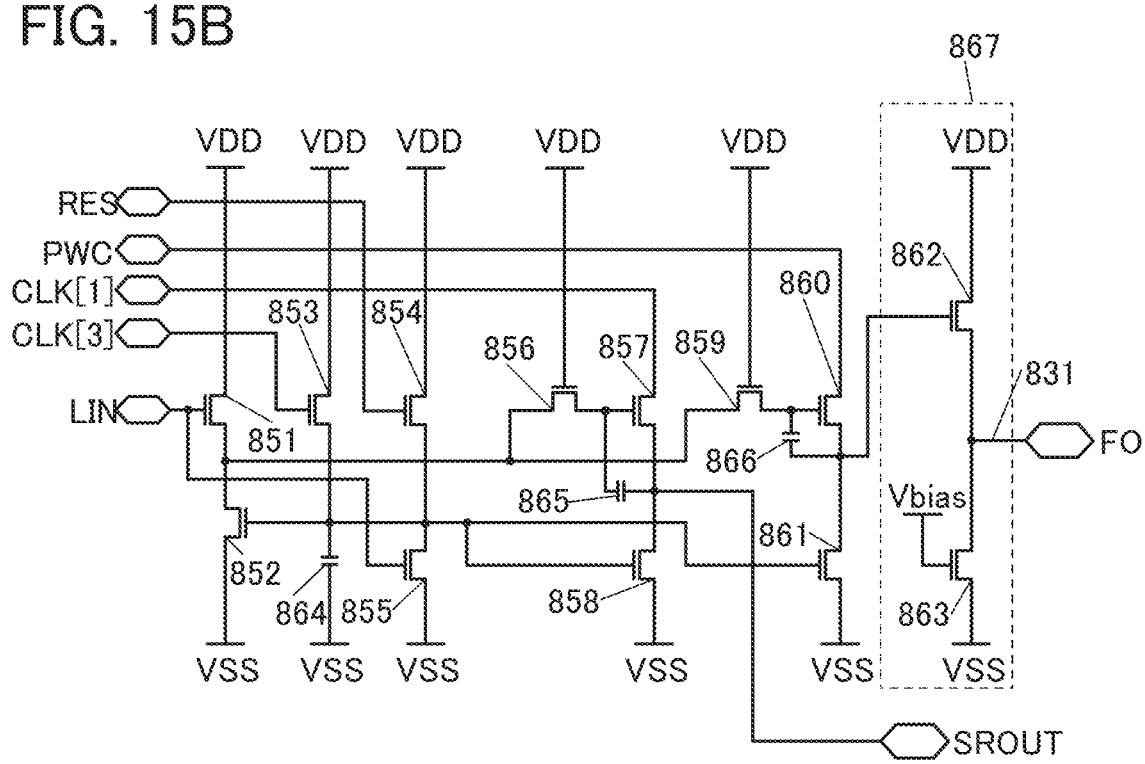
FIG. 15B is a circuit diagram showing a configuration example of a shift register.

FIG. 15B is a circuit diagram illustrating a configuration example of the shift register circuit SR that inputs and outputs the signals illustrated in FIG. 15A. The shift register circuit SR includes a transistor 851 to a transistor 863 and a capacitor 864 to a capacitor 866.

One of a source and a drain of the transistor 851 is electrically connected to one of a source and a drain of the transistor 852, one of a source and a drain of the transistor 856, and one of a source and a drain of the transistor 859. A gate of the transistor 852 is electrically connected to one of a source and a drain of the transistor 853, one of a source and a drain of the transistor 854, one of a source and a drain of the transistor 855, a gate of the transistor 858, a gate of the transistor 861, and one electrode of the capacitor 864. The other of the source and the drain of the transistor 856 is electrically connected to a gate of the transistor 857 and one electrode of the capacitor 865. The other of the source and the drain of the transistor 859 is electrically connected to a gate of the transistor 860 and one electrode of the capacitor 866. One of a source and a drain of the transistor 860 is electrically connected to one of a source and a drain of the transistor 861, a gate of the transistor 862, and the other electrode of the capacitor 866.

The signal LIN is input to a gate of the transistor 851 and a gate of the transistor 855. The signal CLK[3] is input to a gate of the transistor 853. The signal RES is input to a gate of the transistor 854. The signal CLK[1] is input to one of a source and a drain of the transistor 857. The signal PWC is input to the other of the source and the drain of the transistor 860.

One of a source and a drain of the transistor 862 and one of a source and a drain of the transistor 863 are electrically connected to the wiring 831, and the signal FO is output from the wiring 831 as described above. The signal SROUT is output from the other of the source and the drain of the transistor 857, one of a source and a drain of the transistor 858, and the other electrode of the capacitor 865.

The potential VDD is supplied to the other of the source and the drain of the transistor 851, the other of the source and the drain of the transistor 853, the other of the source and the drain of the transistor 854, a gate of the transistor 856, a gate of the transistor 859, and the other of the source and drain of the transistor 862. The potential VSS is supplied to the other of the source and the drain of the transistor 852, the other of the source and the drain of the transistor 855, the other of the source and the drain of the transistor 858, the other of the source and the drain of the transistor 861, the other of the source and the drain of the transistor 863, and the other electrode of the capacitor 864.

The transistor 863 is a bias transistor and has a function of a constant current source. A potential Vbias that is a bias potential can be supplied to a gate of the transistor 863.

The transistor 862 and the transistor 863 form a source follower circuit 867. Even if signal decay or the like due to wiring resistance, parasitic capacitance, or the like occurs inside the register circuit SR, the source follower circuit 867 in the shift register circuit SR can prevent the potential of the signal FO from being lowered by the signal decay or the like. This increases the operating speed of the display device 810. Note that the source follower circuit 867 may be replaced with another circuit as long as the circuit has a function of a buffer.

Structure Example of Region 823

Figure 16:
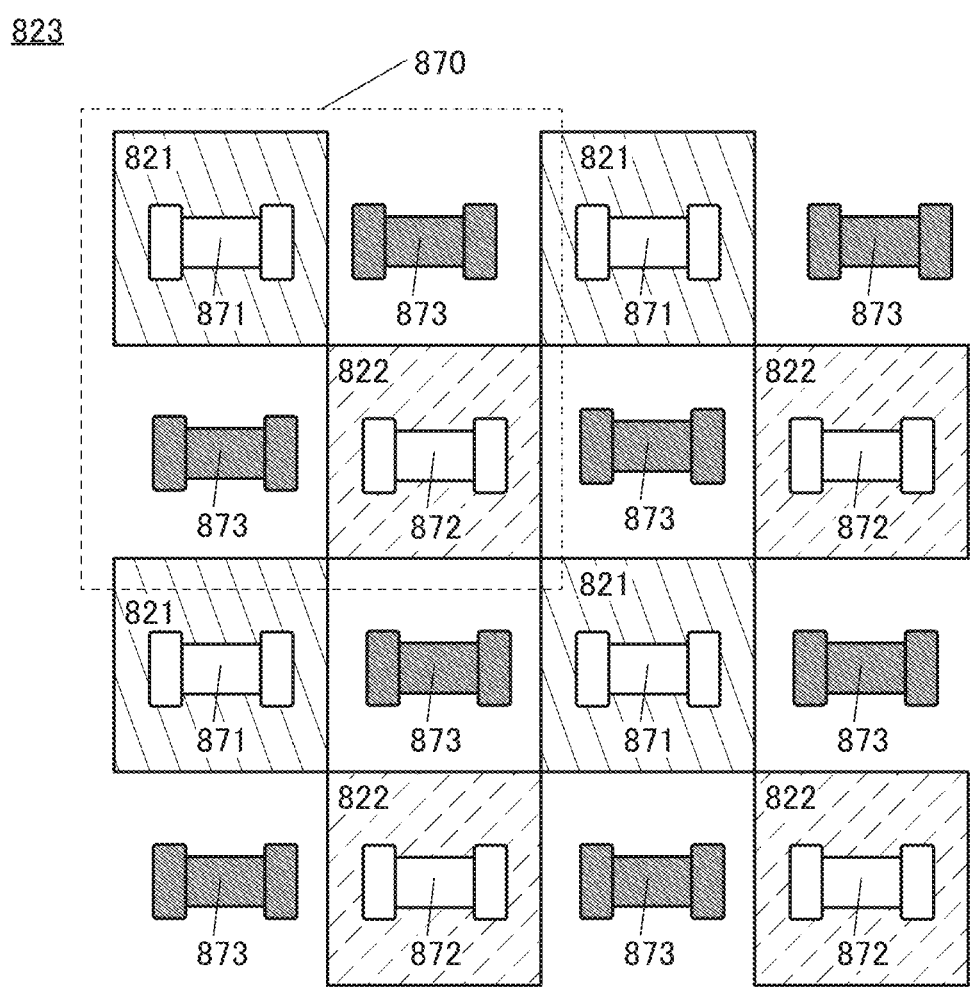
FIG. 16 is a schematic diagram showing an example of placement of a gate driver circuit and a source driver circuit.

FIG. 16 illustrates a structure example of the region 823, where the gate driver circuit 821 and the source driver circuit 822 overlap with each other. As illustrated in FIG. 16, regions including a component of the gate driver circuit 821 and regions including a component of the source driver circuit 822 are arranged in a certain regular pattern in the region 823. FIG. 16 shows a transistor 871 as a component of the gate driver circuit 821, and a transistor 872 as a component of the source driver circuit 822.

FIG. 16 illustrates the case where the regions including the component of the gate driver circuit 821 are provided in the first row and the third row, and the regions including the component of the source driver circuit 822 are provided in the second row and the fourth row. In the region 823, a dummy element is provided between the regions including the component of the gate driver circuit 821. A dummy element is provided between the regions including the component of the source driver circuit 822. FIG. 16 illustrates a structure example of the region 823 in which four dummy transistors 873 as dummy elements are provided around each of the transistor 871 and the transistor 872.

When the dummy elements such as the dummy transistors 873 are provided in the region 823, the dummy elements can absorb impurities and inhibit diffusion of impurities into the transistors 871 and 872 and the like. Thus, the reliability of the transistor 871, the transistor 872, and the like can be increased, leading to higher reliability of the display device 810. Although the transistors 871, the transistors 872, and the dummy transistors 873 are arranged in a matrix in FIG. 16, they need not necessarily be arranged in a matrix.

Figure 17:
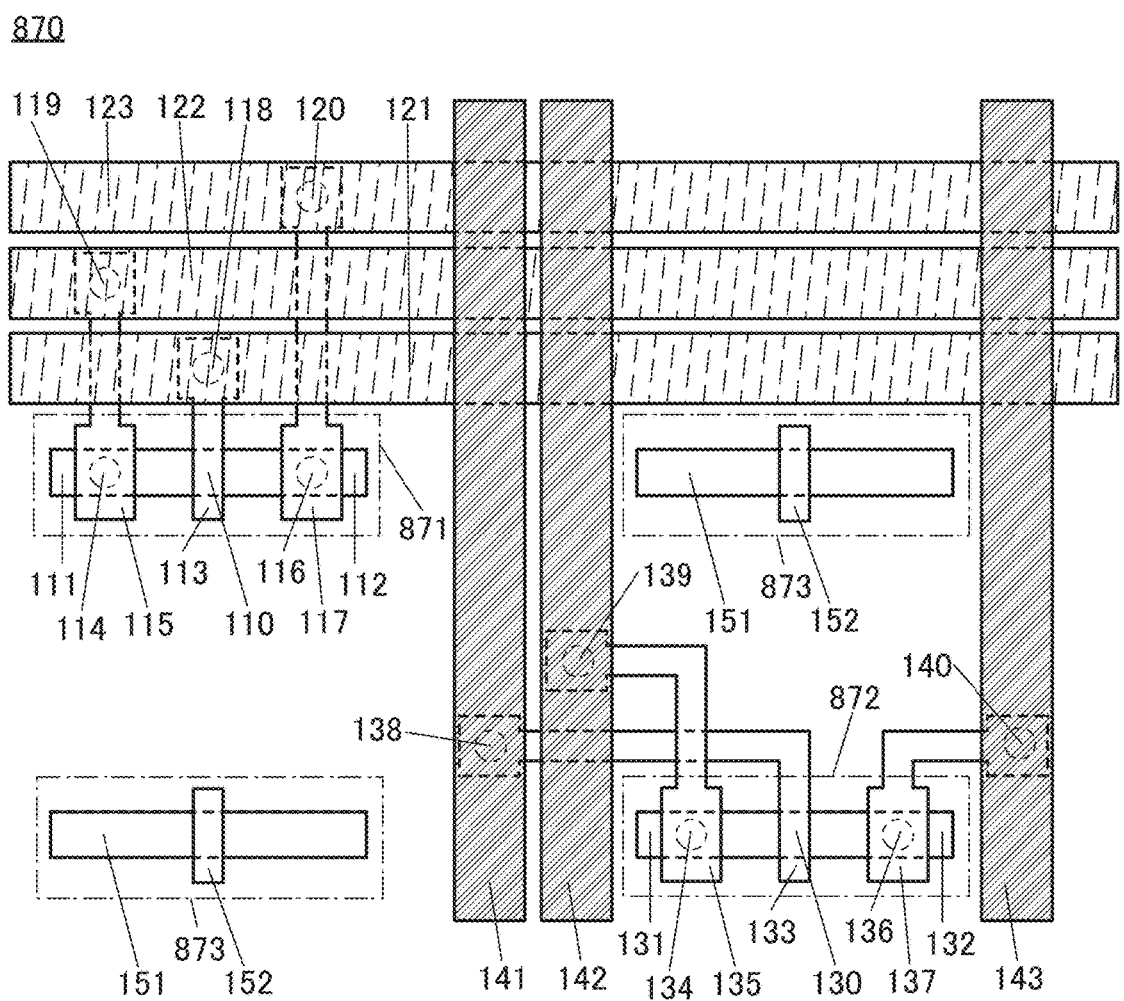
FIG. 17 is a top view showing a structure example of a gate driver circuit and a source driver circuit.

FIG. 17 is a top view illustrating a structure example of a region 870 that is part of the region 823. As illustrated in FIG. 16 and FIG. 17, one transistor 871, one transistor 872, and two dummy transistors 873 are provided in the region 870. As illustrated in FIG. 17, the transistor 871 includes a channel formation region 110, a source region 111, and a drain region 112. The transistor 871 also includes a gate electrode 113 that has a region overlapping with the channel formation region 110.

Note that components such as a gate insulator are not illustrated in FIG. 17. The channel formation region, the source region, and the drain region are not illustrated as clearly separated regions in FIG. 17.

An opening 114 is provided in the source region 111, and the source region 111 is electrically connected to a wiring 115 through the opening 114. An opening 116 is provided in the drain region 112, and the drain region 112 is electrically connected to a wiring 117 through the opening 116.

An opening 118 is provided in the gate electrode 113, and the gate electrode 113 is electrically connected to a wiring 121 through the opening 118. An opening 119 is provided in the wiring 115, and the wiring 115 is electrically connected to a wiring 122 through the opening 119. An opening 120 is provided in the wiring 117, and the wiring 117 is electrically connected to a wiring 123 through the opening 120. In other words, the source region 111 is electrically connected to the wiring 122 through the wiring 115, and the drain region 112 is electrically connected to the wiring 123 through the wiring 117.

The transistor 872 includes a channel formation region 130, a source region 131, and a drain region 132. The transistor 872 also includes a gate electrode 133 that has a region overlapping with the channel formation region 130.

An opening 134 is provided in the source region 131, and the source region 131 is electrically connected to a wiring 135 through the opening 134. An opening 136 is provided in the drain region 132, and the drain region 132 is electrically connected to a wiring 137 through the opening 136.

An opening 138 is provided in the gate electrode 133, and the gate electrode 133 is electrically connected to a wiring 141 through the opening 138. An opening 139 is provided in the wiring 135, and the wiring 135 is electrically connected to a wiring 142 through the opening 139. An opening 140 is provided in the wiring 137, and the wiring 137 is electrically connected to a wiring 143 through the opening 140. In other words, the source region 131 is electrically connected to the wiring 142 through the wiring 135, and the drain region 132 is electrically connected to the wiring 143 through the wiring 137.

Note that the channel formation region 110 and the channel formation region 130 can be provided in one layer. The source region 111 and the drain region 112 can be provided in the same layer as the source region 131 and the drain region 132. The gate electrode 113 and the gate electrode 133 can be provided in one layer. The wirings 115 and 117 and the wirings 135 and 137 can be provided in one layer. That is, the transistor 871 and the transistor 872 can be provided in one layer. Consequently, the manufacturing process of the display device 810 can be simpler than the case where the transistor 871 and the transistor 872 are provided in different layers, making the display device 810 inexpensive.

The wiring 121 to the wiring 123 electrically connected to the transistor 871 included in the gate driver circuit 821 are provided in one layer. The wiring 141 to the wiring 143 electrically connected to the transistor 872 included in the source driver circuit 822 are provided in one layer. The wiring 121 to the wiring 123 are provided in a layer different from the layer where the wiring 141 to the wiring 143 are provided. In the above manner, an electrical short circuit between the transistor 871, which is the component of the gate driver circuit 821, and the transistor 872, which is the component of the source driver circuit 822, can be inhibited. Accordingly, a malfunction of the gate driver circuit 821 and the source driver circuit 822 can be inhibited even when the gate driver circuit 821 and the source driver circuit 822 are not strictly separated from each other and have an overlap region. As a result, the reliability of the display device 810 can be increased.

In this specification and the like, the expression "the same layer as A" means a layer that is formed in the same step as A and contains the same material as A, for example.

Although FIG. 17 illustrates a structure in which the wiring 141 to the wiring 143 are provided above the wiring 121 to the wiring 123, the wiring 141 to the wiring 143 may be provided below the wiring 121 to the wiring 123.

Although FIG. 17 illustrates a structure in which the wiring 121 to the wiring 123 extend in the horizontal direction and the wiring 141 to the wiring 143 extend in the perpendicular direction, one embodiment of the present invention is not limited thereto. For example, the wiring 121 to the wiring 123 may extend in the perpendicular direction, and the wiring 141 to the wiring 143 may extend in the horizontal direction. Alternatively, the wiring 121 to the wiring 123 and the wiring 141 to the wiring 143 may all extend in the horizontal direction or in the perpendicular direction.

The dummy transistor 873 includes a semiconductor 151 and a conductor 152. The conductor 152 includes a region overlapping with the semiconductor 151. The semiconductor 151 can be formed in the same layer as the channel formation regions of the transistor 871 and the transistor 872. The conductor 152 can be formed in the same layer as the gate electrodes of the transistor 871 and the transistor 872. Note that one of the semiconductor 151 and the conductor 152 may be omitted in the dummy transistor 873.

The semiconductor 151 and the conductor 152 can be electrically isolated from other wirings or the like. A constant potential may be supplied to the semiconductor 151 and/or the conductor 152. For example, a ground potential may be supplied.

Structure Example of Pixel 834

Figure 18A:
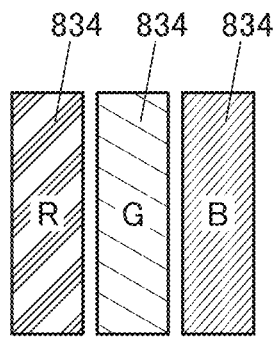
FIG. 18A, FIG. 18B, FIG. 18C, FIG. 18D, FIG. 18E, FIG. 18F, and FIG. 18G are diagrams each showing a structure example of a pixel.
Figure 18B:
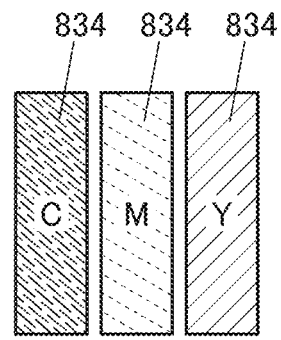

FIG. 18A to FIG. 18G are diagrams for describing colors exhibited by the pixels 834 provided in the display device 810. As illustrated in FIG. 18A, the display device of one embodiment of the present invention can include the pixel 834 having a function of emitting red light (R), the pixel 834 having a function of emitting green light (G), and the pixel 834 having a function of emitting blue light (B). Alternatively, as illustrated in FIG. 18B, the display device 810 may include the pixel 834 having a function of emitting cyan light (C), the pixel 834 having a function of emitting magenta light (M), and the pixel 834 having a function of emitting yellow light (Y).

Figure 18C:
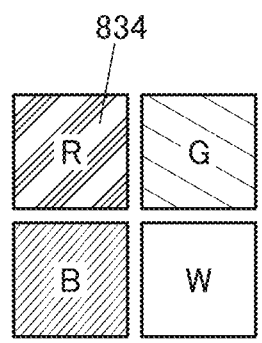
Figure 18D:
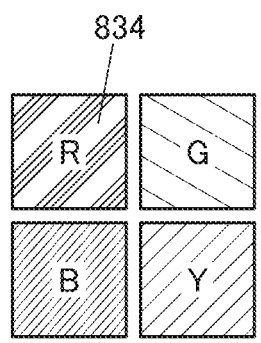

Alternatively, as illustrated in FIG. 18C, the display device 810 may include the pixel 834 having a function of emitting red light (R), the pixel 834 having a function of emitting green light (G), the pixel 834 having a function of emitting blue light (B), and the pixel 834 having a function of emitting white light (W). Alternatively, as illustrated in FIG. 18D, the display device 810 may include the pixel 834 having a function of emitting red light (R), the pixel 834 having a function of emitting green light (G), the pixel 834 having a function of emitting blue light (B), and the pixel 834 having a function of emitting yellow light (Y). Alternatively, as illustrated in FIG. 18E, the display device 810 may include the pixel 834 having a function of emitting cyan light (C), the pixel 834 having a function of emitting magenta light (M), the pixel 834 having a function of emitting yellow light (Y), and the pixel 834 having a function of emitting white light (W).

Figure 18E:
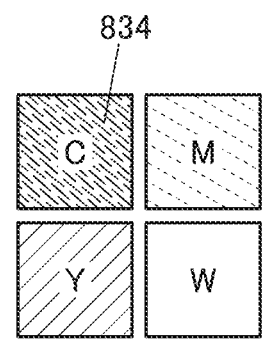

Providing the pixel 834 having a function of emitting white light (W) in the display device 810 as illustrated in FIG. 18C and FIG. 18E can increase the luminance of a displayed image. Furthermore, increasing the number of colors emitted by the pixels 834 as illustrated in FIG. 18D and the like can increase the reproducibility of intermediate colors and improve the display quality.

Figure 18F:
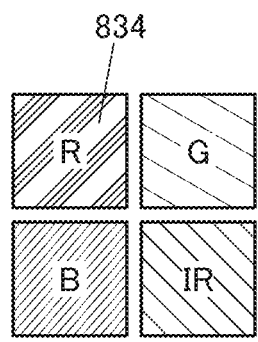
Figure 18G:
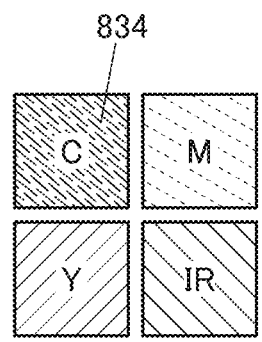

As illustrated in FIG. 18F, the display device 810 may include the pixel 834 having a function of emitting infrared light (IR) in addition to the pixel 834 having a function of emitting red light (R), the pixel 834 having a function of emitting green light (G), and the pixel 834 having a function of emitting blue light (B). Alternatively, as illustrated in FIG. 18G, the display device 810 may include the pixel 834 having a function of emitting infrared light (IR) in addition to the pixel 834 having a function of emitting cyan light (C), the pixel 834 having a function of emitting magenta light (M), and the pixel 834 having a function of emitting yellow light (Y). Alternatively, the display device 810 may include the pixel 834 having a function of emitting white light (W) in addition to the pixels 834 illustrated in FIG. 18F or FIG. 18G.

Figure 19A:
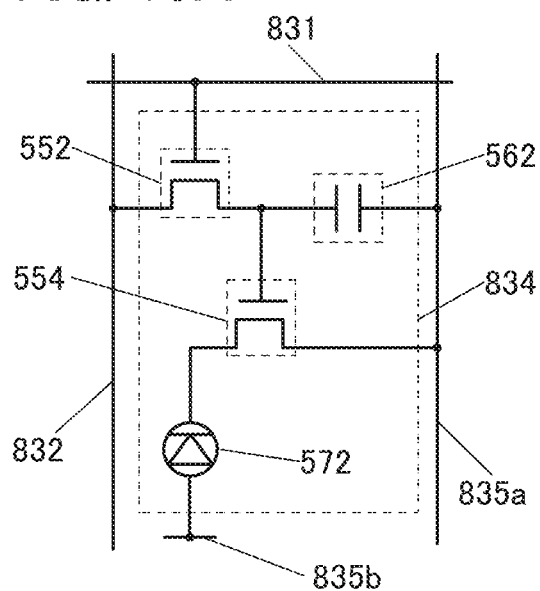
FIG. 19A and FIG. 19B are circuit diagrams each showing a configuration example of a pixel.
Figure 19B:
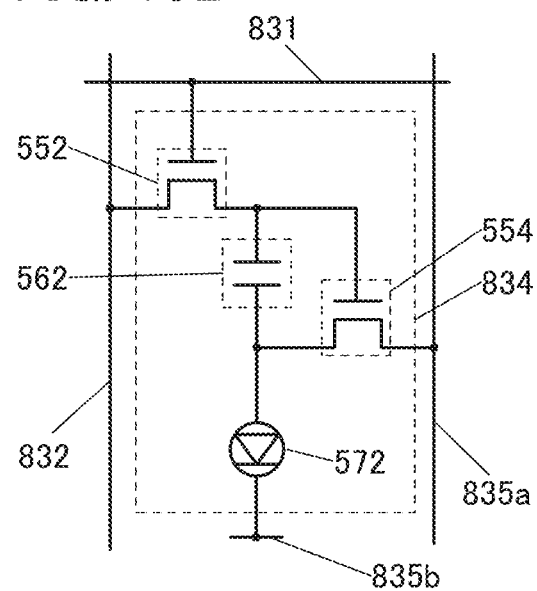

FIG. 19A and FIG. 19B are circuit diagrams each illustrating a configuration example of the pixel 834. The pixel 834 having the configuration illustrated in FIG. 19A includes a transistor 552, a transistor 554, a capacitor 562, and a light-emitting device 572. As the light-emitting device 572, an EL device utilizing electroluminescence can be used, for example. The EL device includes a layer containing a light-emitting compound (hereinafter also referred to as EL layer) between a pair of electrodes. When a potential difference that is greater than the threshold voltage of the EL device is generated between the pair of electrodes, holes are injected to the EL layer from the anode side and electrons are injected to the EL layer from the cathode side. The injected electrons and holes are recombined in the EL layer and a light-emitting substance contained in the EL layer emits light.

EL devices are classified according to whether a light-emitting material is an organic compound or an inorganic compound. In general, the former is referred to as an organic EL device, and the latter is referred to as an inorganic EL device.

In an organic EL device, by voltage application, electrons are injected from one electrode to the EL layer and holes are injected from the other electrode to the EL layer. Then, the carriers (electrons and holes) are recombined, and thus, a light-emitting organic compound is excited. The light-emitting organic compound returns to a ground state from the excited state, thereby emitting light. Owing to such a mechanism, this light-emitting device is referred to as a current-excitation light-emitting device.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport properties), and the like.

The EL layer can be formed by an evaporation method (including a vacuum evaporation method), a transfer method, a printing method, an inkjet method, a coating method, or the like.

The inorganic EL devices are classified according to their device structures into a dispersion-type inorganic EL device and a thin-film inorganic EL device. A dispersion-type inorganic EL device includes a light-emitting layer where particles of a light-emitting material are dispersed in a binder, and its light emission mechanism is donor-acceptor recombination type light emission that utilizes a donor level and an acceptor level. A thin-film inorganic EL device has a structure where a light-emitting layer is positioned between dielectric layers, which are further positioned between electrodes, and its light emission mechanism is localization type light emission that utilizes inner-shell electron transition of metal ions.

In order to extract light emitted from the light-emitting device, at least one of the pair of electrodes needs to be transparent. The light-emitting device that is formed over a substrate together with a transistor can have any of a top emission structure in which emitted light is extracted through the surface opposite to the substrate; a bottom emission structure in which emitted light is extracted through the surface on the substrate side; and a dual emission structure in which emitted light is extracted through both sides.

Note that a device similar to the light-emitting device 572 can be used as light-emitting devices other than the light-emitting device 572.

One of a source and a drain of the transistor 552 is electrically connected to the wiring 832. The other of the source and the drain of the transistor 552 is electrically connected to one electrode of the capacitor 562 and a gate of the transistor 554. The other electrode of the capacitor 562 is electrically connected to a wiring 835*a*. A gate of the transistor 552 is electrically connected to the wiring 831. One of a source and a drain of the transistor 554 is electrically connected to the wiring 835*a*. The other of the source and the drain of the transistor 554 is electrically connected to one electrode of the light-emitting device 572. The other electrode of the light-emitting device 572 is electrically connected to a wiring 835*b*. The potential VSS is supplied to the wiring 835*a*, and the potential VDD is supplied to the wiring 835*b*. The wiring 835*a* and the wiring 835*b* function as power supply lines.

In the pixel 834 having the configuration illustrated in FIG. 19A, a current flowing through the light-emitting device 572 is controlled in accordance with a potential supplied to the gate of the transistor 554, whereby the luminance of light emitted from the light-emitting device 572 is controlled.

FIG. 19B illustrates a configuration different from that of the pixel 834 in FIG. 19A. In the pixel 834 having the configuration illustrated in FIG. 19B, one of the source and the drain of the transistor 552 is electrically connected to the wiring 832. The other of the source and the drain of the transistor 552 is electrically connected to one electrode of the capacitor 562 and the gate of the transistor 554. The gate of the transistor 552 is electrically connected to the wiring 831. One of the source and the drain of the transistor 554 is electrically connected to the wiring 835*a*. The other of the source and the drain of the transistor 554 is electrically connected to the other electrode of the capacitor 562 and one electrode of the light-emitting device 572. The other electrode of the light-emitting device 572 is electrically connected to the wiring 835*b*. The potential VDD is supplied to the wiring 835*a*, and the potential VSS is supplied to the wiring 835*b*.

Figure 20A:
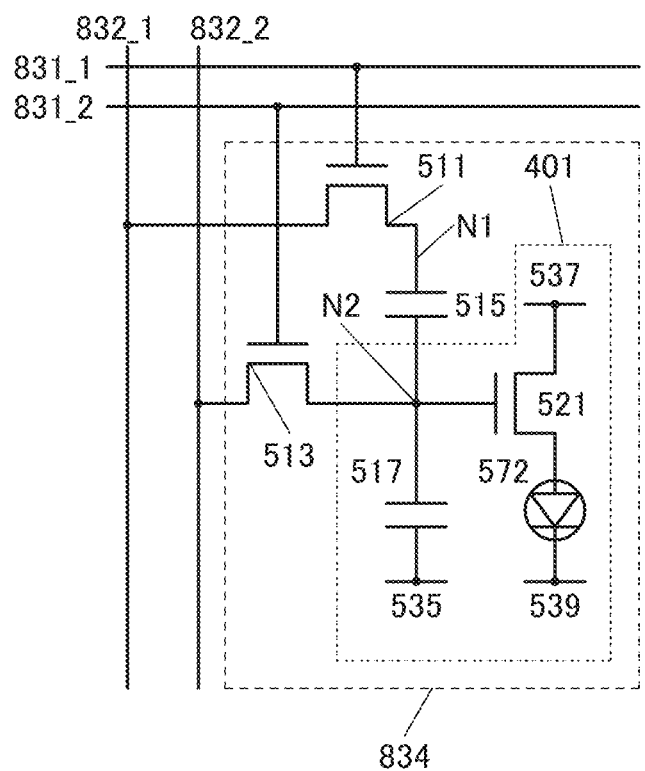
FIG. 20A is a circuit diagram showing a configuration example of a pixel.

FIG. 20A illustrates a configuration example of the pixel 834 different from the pixel 834 having the configuration in FIG. 19A to FIG. 19B in including a memory. The pixel 834 having the configuration in FIG. 20A includes a transistor 511, a transistor 513, a transistor 521, a capacitor 515, a capacitor 517, and the light-emitting device 572. To the pixel 834, a wiring 831_1 and a wiring 831_2 are electrically connected as the wiring 831 functioning as a scan line, and a wiring 832_1 and a wiring 832_2 are electrically connected as the wiring 832 functioning as a data line.

One of a source and a drain of the transistor 511 is electrically connected to the wiring 832_1. The other of the source and the drain of the transistor 511 is electrically connected to one electrode of the capacitor 515. A gate of the transistor 511 is electrically connected to the wiring 831_1. One of a source and a drain of the transistor 513 is electrically connected to the wiring 832_2. The other of the source and the drain of the transistor 513 is electrically connected to the other electrode of the capacitor 515. A gate of the transistor 513 is electrically connected to the wiring 831_2. The other electrode of the capacitor 515 is electrically connected to one electrode of the capacitor 517. The one electrode of the capacitor 517 is electrically connected to a gate of the transistor 521. One of a source and a drain of the transistor 521 is electrically connected to one electrode of the light-emitting device 572. The other electrode of the capacitor 517 is electrically connected to a wiring 535. The other of the source and the drain of the transistor 521 is electrically connected to a wiring 537. The other electrode of the light-emitting device 572 is electrically connected to a wiring 539.

In this specification and the like, a voltage supplied to a light-emitting device indicates a difference between a potential supplied to one electrode of the light-emitting device and a potential supplied to the other electrode of the light-emitting device.

A node where the other of the source and the drain of the transistor 511 and the one electrode of the capacitor 515 are electrically connected to each other is referred to as a node N1. A node where the other of the source and the drain of the transistor 513, the one electrode of the capacitor 517, and the gate of the transistor 521 are electrically connected to each other is referred to as a node N2. In FIG. 20A, a circuit composed of the capacitor 517, the transistor 521, and the light-emitting device 572 is referred to as a circuit 401.

The wiring 535 can be shared by all pixels 834 provided in the display device 810, for example. In that case, a potential supplied to the wiring 535 is a common potential. A constant potential can be supplied to the wiring 537 and the wiring 539. For example, a high potential can be supplied to the wiring 537, and a low potential can be supplied to the wiring 539. The wiring 537 and the wiring 539 function as power supply lines.

The transistor 521 has a function of controlling a current to be supplied to the light-emitting device 572. The capacitor 517 functions as a storage capacitor. The capacitor 517 may be omitted.

Note that FIG. 20A illustrates a configuration in which the anode of the light-emitting device 572 is electrically connected to the transistor 521; alternatively, the transistor 521 may be electrically connected to the cathode. In that case, the value of the potential of the wiring 537 and the value of the potential of the wiring 539 can be changed as appropriate.

In the pixel 834, turning off the transistor 511 enables retention of the potential of the node N1. Turning off the transistor 513 enables retention of the potential of the node N2. Furthermore, by turning off the transistor 513 and then writing a predetermined potential to the node N1 through the transistor 511, the potential of the node N2 can be changed in accordance with a change in the potential of the node N1 by capacitive coupling through the capacitor 515.

A transistor containing a metal oxide in a channel formation region (hereinafter also referred to as OS transistor) can be used as the transistor 511 and the transistor 513. A metal oxide can have a band gap of 2 eV or more, or 2.5 eV or more. Thus, an OS transistor exhibits an extremely low leakage current (off-state current) in an off state. Accordingly, the use of OS transistors as the transistors 511 and 513 enables the potentials of the nodes N1 and N2 to be held for a long time.

The metal oxide can be, for example, an In—M—Zn oxide (the element M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). In particular, aluminum, gallium, yttrium, or tin is preferably used for the element M. Alternatively, indium oxide, zinc oxide, an In—Ga oxide, an In—Zn oxide, a Ga—Zn oxide, or gallium oxide may be used as the metal oxide.

Example of Operation Method for Pixel 834

Figure 20B:
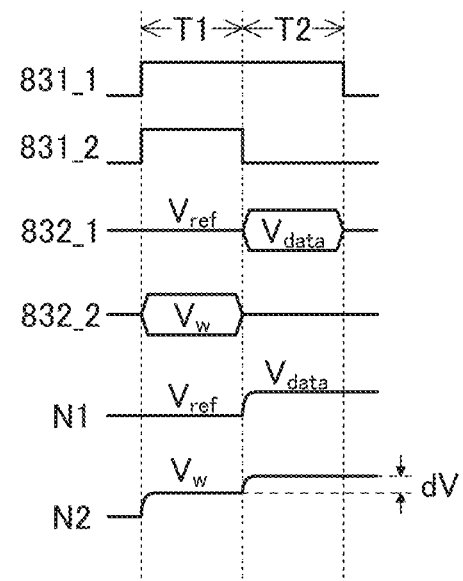
FIG. 20B is a timing chart showing an example of a method for operating a pixel.

Next, an example of an operation method for the pixel 834 having the configuration in FIG. 20A will be described with reference to FIG. 20B. FIG. 20B is a timing chart of the operation of the pixel 834 having the configuration in FIG. 20A. Note that for simplification of the description, the influence of various kinds of resistance such as wiring resistance; parasitic capacitance of a transistor, a wiring, or the like; and the threshold voltage of a transistor, for example, is not taken into consideration here.

In the operation shown in FIG. 20B, one frame period is divided into a period T1 and a period T2. The period T1 is a period in which a potential is written to the node N2, and the period T2 is a period in which a potential is written to the node N1.

In the period T1, a potential for turning on the transistor is supplied to both the wiring 831_1 and the wiring 831_2.

In addition, a potential $V_{ref}$ that is a fixed potential is supplied to the wiring 832_1, and a potential $V_w$ is supplied to the wiring 832_2.

The potential $V_{ref}$ is supplied from the wiring 832_1 to the node N1 through the transistor 511. The potential $V_w$ is supplied from the wiring 832_2 to the node N2 through the transistor 513. Thus, a potential difference $V_w - V_{ref}$ is retained in the capacitor 515.

Then, in the period T2, a potential for turning on the transistor 511 is supplied to the wiring 831_1, and a potential for turning off the transistor 513 is supplied to the wiring 831_2. A potential $V_{data}$ is supplied to the wiring 832_1, and a predetermined constant potential is supplied to the wiring 832_2. Note that the potential of the wiring 832_2 may be floating.

The potential $V_{data}$ is supplied to the node N1 through the transistor 511. At this time, owing to capacitive coupling through the capacitor 515, the potential of the node N2 is changed by a potential dV in accordance with the potential $V_{data}$. That is, a potential that is the sum of the potential $V_w$ and the potential dV is input to the circuit 401. Note that although the potential dV is shown as having a positive value in FIG. 20B, the potential dV may have a negative value. That is, the potential $V_{data}$ may be lower than the potential $V_{ref}$.

Here, the potential dV is roughly determined by the capacitance of the capacitor 515 and the capacitance of the circuit 401. When the capacitance of the capacitor 515 is sufficiently larger than the capacitance of the circuit 401, the potential dV becomes close to a potential difference $V_{data} - V_{ref}$.

As described above, the pixel 834 can generate the potential supplied to the node N2 in combination with two kinds of data signals; thus, an image displayed on the pixel array 833 can be corrected inside the pixel 834. Here, one of the two kinds of data signals can be the aforementioned image signal, and the other of the two kinds of data can be a correction signal, for example. For example, when the potential $V_w$ corresponding to a correction signal is supplied to the node N2 in the period T1 and then the potential $V_{data}$ corresponding to an image signal is supplied to the node N1 in the period T2, an image based on the image signal corrected by the correction signal can be displayed on the pixel array 833. Note that not only image signals but also correction signals and the like can be generated by the source driver circuit 822 included in the display device 810.

In the pixel 834 having the configuration in FIG. 20A, the potential of the node N2 can be set higher than the maximum potential that can be supplied to the wirings 832_1 and 832_2. Thus, a high voltage can be supplied to the light-emitting device 572. Specifically, the potential of the wiring 537 can be set higher, for example. Accordingly, when the light-emitting device 572 is an organic EL device, the light-emitting device can employ a tandem structure described later. This increases the current efficiency and external quantum efficiency of the light-emitting device 572. Thus, a high-luminance image can be displayed on the display device 810. Moreover, power consumption of the display device 810 can be reduced.

Note that the pixel configuration is not limited to that illustrated in FIG. 20A, and a transistor, a capacitor, or the like may be added. For example, when one transistor and one capacitor are added to the configuration in FIG. 20A, three nodes capable of holding a potential can be provided. That is, the pixel 834 can have another node capable of holding a potential, in addition to the node N1 and the node N2. Thus, the potential of the node N2 can be further increased. Consequently, a larger amount of current can flow through the light-emitting device 572.

FIG. 21A to FIG. 21E illustrate configuration examples of the circuit 401 different from that in FIG. 20A. Like the circuit 401 with the configuration illustrated in FIG. 21A, the circuit 401 with the configuration illustrated in FIG. 20A includes the capacitor 517, the transistor 521, and the light-emitting device 572.

In the circuit 401 with the configuration illustrated in FIG. 21A, the gate of the transistor 521 and one electrode of the capacitor 517 are electrically connected to the node N2. One of the source and the drain of the transistor 521 is electrically connected to the wiring 537. The other of the source and the drain of the transistor 521 is electrically connected to the other electrode of the capacitor 517. The other electrode of the capacitor 517 is electrically connected to one electrode of the light-emitting device 572. The other electrode of the light-emitting device 572 is electrically connected to the wiring 539.

Like the circuit 401 with the configuration illustrated in FIG. 20A, the circuit 401 with the configuration illustrated in FIG. 21B includes the capacitor 517, the transistor 521, and the light-emitting device 572.

In the circuit 401 with the configuration illustrated in FIG. 21B, the gate of the transistor 521 and one electrode of the capacitor 517 are electrically connected to the node N2. One electrode of the light-emitting device 572 is electrically connected to the wiring 537. The other electrode of the light-emitting device 572 is electrically connected to one of the source and the drain of the transistor 521. The other of the source and the drain of the transistor 521 is electrically connected to the other electrode of the capacitor 517. The other electrode of the capacitor 517 is electrically connected to the wiring 539.

FIG. 21C illustrates a configuration example of the circuit 401 in which a transistor 525 is added to the circuit 401 in FIG. 21A. One of a source and a drain of the transistor 525 is electrically connected to the other of the source and the drain of the transistor 521 and the other electrode of the capacitor 517. The other of the source and the drain of the transistor 525 is electrically connected to one electrode of the light-emitting device 572. A gate of the transistor 525 is electrically connected to a wiring 541. The wiring 541 has a function of a scan line for controlling the conduction of the transistor 525.

In the pixel 834 including the circuit 401 with the configuration illustrated in FIG. 21C, even when the potential of the node N2 becomes higher than the threshold voltage of the transistor 521, a current does not flow through the light-emitting device 572 unless the transistor 525 is turned on. Thus, a malfunction of the display device 810 can be inhibited.

FIG. 21D illustrates a configuration example of the circuit 401 in which a transistor 527 is added to the circuit 401 in FIG. 21C. One of a source and a drain of the transistor 527 is electrically connected to the other of the source and the drain of the transistor 521. The other of the source and the drain of the transistor 527 is electrically connected to a wiring 543. A gate of the transistor 527 is electrically connected to a wiring 545. The wiring 545 has a function of a scan line for controlling the conduction of the transistor 527.

The wiring 543 can be electrically connected to a supply source of a certain potential such as a reference potential. That is, the wiring 543 has a function of a power supply line. Supplying a certain potential from the wiring 543 to the other of the source and the drain of the transistor 521 enables stable writing of an image signal to the pixel 834.

The wiring 543 can be electrically connected to a circuit 520. The circuit 520 can have at least one of a function of a supply source of the certain potential, a function of obtaining electrical characteristics of the transistor 521, and a function of generating a correction signal.

The circuit 401 having the configuration illustrated in FIG. 21E includes the capacitor 517, the transistor 521, a transistor 529, and the light-emitting device 572.

In the circuit 401 with the configuration illustrated in FIG. 21E, the gate of the transistor 521 and one electrode of the capacitor 517 are electrically connected to the node N2. One of the source and the drain of the transistor 521 is electrically connected to the wiring 537. One of a source and a drain of the transistor 529 is electrically connected to the wiring 543.

The other electrode of the capacitor 517 is electrically connected to the other of the source and the drain of the transistor 521. The other of the source and the drain of the transistor 521 is electrically connected to the other of the source and the drain of the transistor 529. The other of the source and the drain of the transistor 529 is electrically connected to one electrode of the light-emitting device 572.

A gate of the transistor 529 is electrically connected to the wiring 831_1. The other electrode of the light-emitting device 572 is electrically connected to the wiring 539.

Structure Example 2 of Display Device

Figure 22:
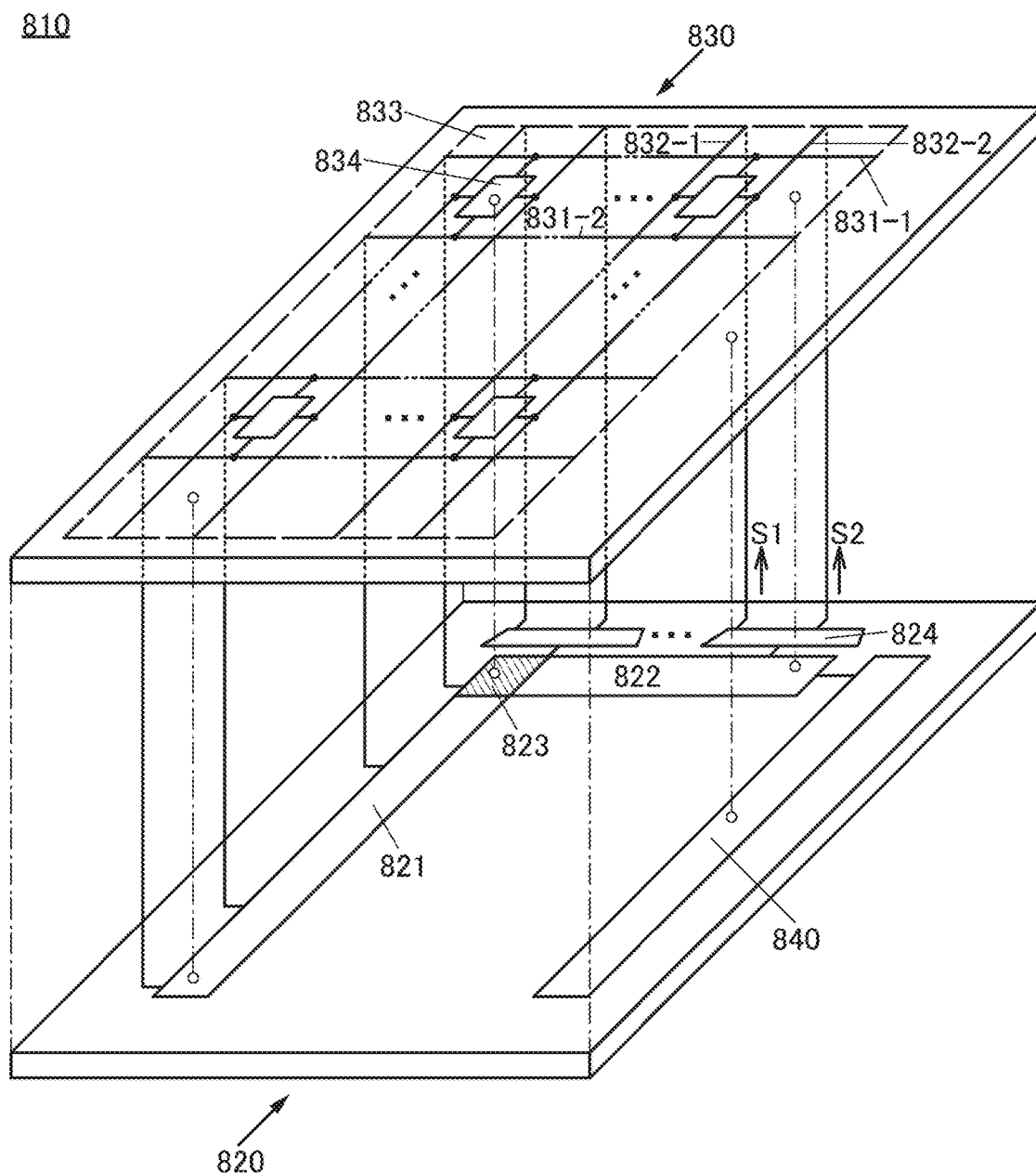
FIG. 22 is a diagram showing a structure example of a display device.

FIG. 22 is a block diagram illustrating a structure example of the display device 810 in which the pixels 834 have the configuration illustrated in FIG. 20A. In the display device 810 having the structure illustrated in FIG. 22, a demultiplexer circuit 824 is provided in addition to the components of the display device 810 illustrated in FIG. 5. The demultiplexer circuit 824 can be provided in the layer 820 as illustrated in FIG. 22, for example. Note that the number of demultiplexer circuits 824 can be equal to the number of columns of the pixels 834 arranged in the pixel array 833, for example.

The gate driver circuit 821 is electrically connected to the pixel 834 through a wiring 831-1. The gate driver circuit 821 is electrically connected to the pixel 834 through a wiring 831-2. The wiring 831-1 and the wiring 831-2 function as scan lines.

The source driver circuit 822 is electrically connected to an input terminal of the demultiplexer circuit 824. A first output terminal of the demultiplexer circuit 824 is electrically connected to the pixel 834 through a wiring 832-1. A second output terminal of the demultiplexer circuit 824 is electrically connected to the pixel 834 through a wiring 832-2. The wiring 832-1 and the wiring 832-2 function as data lines.

Note that the source driver circuit 822 and the demultiplexer circuits 824 may be collectively referred to as a source driver circuit. In other words, the demultiplexer circuits 824 may be included in the source driver circuit 822.

In the display device 810 having the structure in FIG. 22, the source driver circuit 822 has a function of generating an image signal S1 and an image signal S2. The demultiplexer circuit 824 has a function of supplying the image signal S1 to the pixel 834 through the wiring 832-1, and a function of supplying the image signal S2 to the pixel 834 through the wiring 832-2. Here, when the display device 810 having the structure in FIG. 22 operates with the method illustrated in FIG. 20B, the potential $V_{data}$ can be a potential corresponding to the image signal S1 and the potential $V_w$ can be a potential corresponding to the image signal S2.

When the potential $V_w$ is supplied to the node N2 and then the potential $V_{data}$ is supplied to the node N1 as shown in FIG. 20B, the potential of the node N2 becomes $V_w$+dV. Here, the potential dV corresponds to the potential $V_{data}$ as described above. As a result, the image signal S1 can be added to the image signal S2. That is, the image signal S1 can be superimposed on the image signal S2.

The level of the potential $V_{data}$ corresponding to the image signal S1 and the level of the potential $V_w$ corresponding to the image signal S2 are limited by the withstand voltage of the source driver circuit 822, for example. In view of this, superimposing the image signal S1 and the image signal S2 enables an image corresponding to an image signal having a potential higher than a potential that the source driver circuit 822 can output, to be displayed on the pixel array 833. Thus, a large amount of current can flow through the light-emitting device 572; hence, the pixel array 833 can display a high-luminance image. Moreover, the dynamic range, which is the range of luminance of images that the pixel array 833 can display, can be enlarged.

An image corresponding to the image signal S1 and an image corresponding to the image signal S2 may be the same or different from each other. When an image corresponding to the image signal S1 and an image corresponding to the image signal S2 are the same, the pixel array 833 can display an image with higher luminance than the luminance of the image corresponding to either the image signal S1 or the image signal S2.

Figure 23:
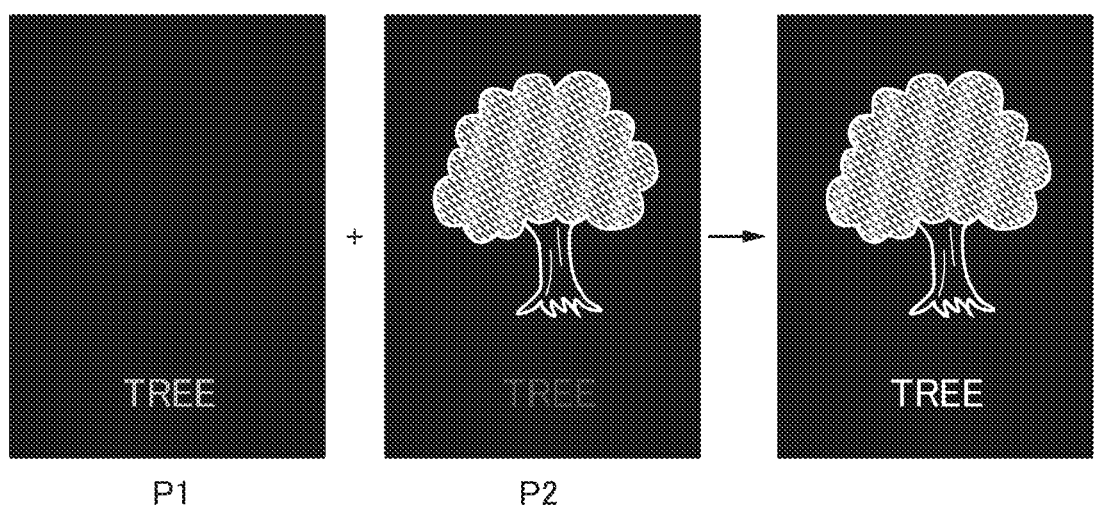
FIG. 23 is a diagram illustrating an operation example of a display device.

FIG. 23 shows the case where an image P1 corresponding to the image signal S1 includes only letters (TREE), and an image P2 corresponding to the image signal S2 includes a picture and letters. In this case, when the image P1 and the image P2 are superimposed on each other, the luminance of the letters can be increased, whereby the letters can be emphasized, for example. As illustrated in FIG. 20B, the potential of the node N2 is changed in accordance with the potential $V_{data}$ after the potential $V_w$ is written to the node N2; hence, to rewrite the potential $V_w$ corresponding to the image signal S2, the potential $V_{data}$ of the image signal S1 needs to be written again. Meanwhile, to rewrite the potential $V_{data}$, the potential $V_w$ does not need to be rewritten as long as the charge written to the node N2 at the time T1 shown in FIG. 20B is retained without being leaked through the transistor 513 or the like. Therefore, in the case illustrated in FIG. 23, the luminance of the letters can be controlled by adjusting the level of the potential $V_{data}$.

Here, to rewrite the potential $V_w$ corresponding to the image signal S2, the potential $V_{data}$ corresponding to the image signal S1 needs to be written again as described above. On the other hand, to rewrite the potential $V_{data}$, the potential $V_w$ does not need to be rewritten. Therefore, the image P2 is preferably an image that needs to be rewritten less frequently than the image P1. Note that the image P1 is not limited to an image including only letters, and the image P2 is not limited to an image including a picture and letters.

At least part of this embodiment can be implemented in combination with the other embodiments described in this specification as appropriate.

Embodiment 2

Examples of an electronic device that can use the display device of one embodiment of the present invention include display devices, personal computers, image storage devices or image reproducing devices provided with storage media, cellular phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. Specific examples of these electronic devices are illustrated in FIG. 24.

Figure 24A:
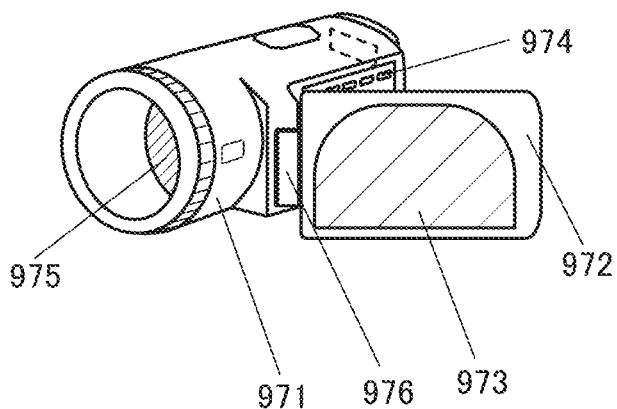
FIG. 24A, FIG. 24B, FIG. 24C, FIG. 24D, FIG. 24E, and FIG. 24F are diagrams each illustrating an electronic device.

FIG. 24A illustrates a video camera, which includes a first housing 971, a second housing 972, a display unit 973, operation keys 974, a lens 975, a joint 976, and the like. The operation keys 974 and the lens 975 are provided on the first housing 971, and the display unit 973 is provided on the second housing 972. The display unit 973 of the video camera includes the display device of one embodiment of the present invention, so that outdoor visibility can be improved and low power consumption can be achieved.

Figure 24B:
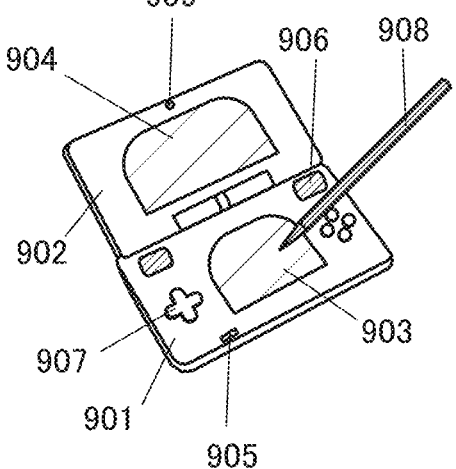

FIG. 24B illustrates a portable game machine, which includes a housing 901, a housing 902, a display unit 903, a display unit 904, a microphone 905, speakers 906, an operation key 907, a stylus 908, a camera 909, and the like. Although the portable game machine in FIG. 24E has the two display units 903 and 904, the number of display units included in a portable game machine is not limited to this. The display unit 903 of the portable game machine includes the display device of one embodiment of the present invention, so that outdoor visibility can be improved and low power consumption can be achieved.

Figure 24C:
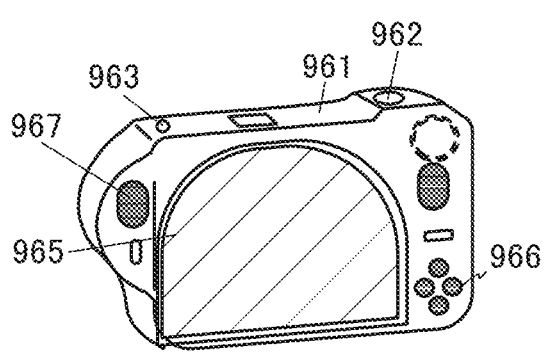

FIG. 24C illustrates a digital camera, which includes a housing 961, a shutter button 962, a microphone 963, a speaker 967, a display unit 965, operation keys 966, and the like. The display unit 965 of the digital camera includes the display device of one embodiment of the present invention, so that outdoor visibility can be improved and low power consumption can be achieved.

Figure 24D:
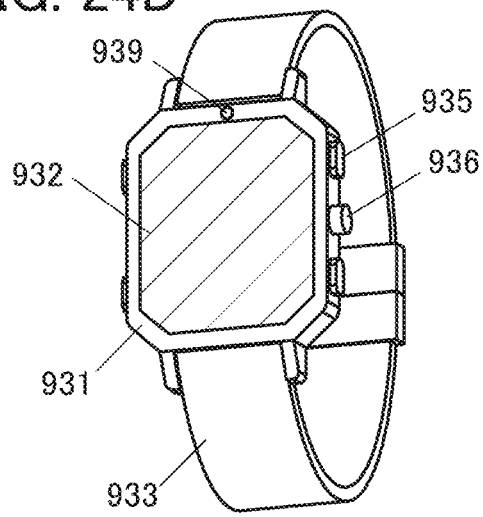

FIG. 24D illustrates a wrist-watch-type information terminal, which includes a housing 931, a display unit 932, a wristband 933, operation buttons 935, a winder 936, a camera 939, and the like. The display unit 932 may be a touch panel. The display unit 932 of the information terminal includes the display device of one embodiment of the present invention, so that outdoor visibility can be improved. Furthermore, the bezel can be narrowed, and thus the design can be improved.

Figure 24E:
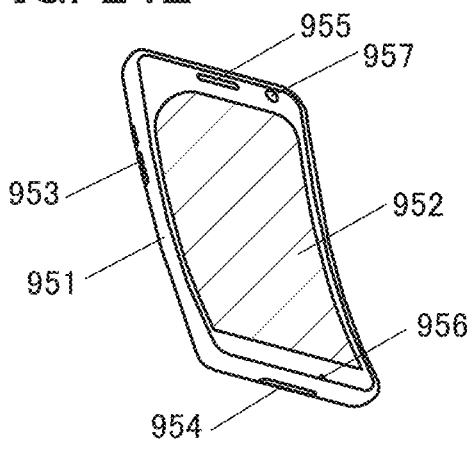

FIG. 24E is an example of a mobile phone, which includes a housing 951, a display unit 952, an operation button 953, an external connection port 954, a speaker 955, a microphone 956, a camera 957, and the like. The mobile phone includes a touch sensor in the display unit 952. Operations such as making a call and inputting characters can be performed by touch on the display unit 952 with a finger, a stylus, or the like. The display unit 952 of the mobile phone includes the display device of one embodiment of the present invention, so that outdoor visibility can be improved. Furthermore, the bezel can be narrowed, and thus the design can be improved.

Figure 24F:
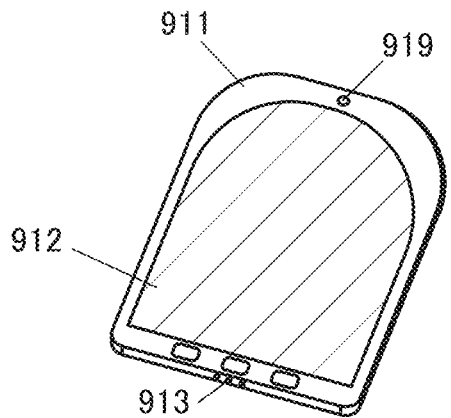

FIG. 24F illustrates a portable data terminal, which includes a housing 911, a display unit 912, a speaker 913, a camera 919, and the like. The touch panel function of the display unit 912 enables input and output of data. The display unit 932 of the portable data terminal includes the display device of one embodiment of the present invention, so that outdoor visibility can be improved. Furthermore, the bezel can be narrowed, and thus the portable data terminal can be small.

At least part of this embodiment can be implemented in combination with the other embodiment described in this specification as appropriate.

REFERENCE NUMERALS

SC_1: contact portion, SC_2: contact portion, SC_4: contact portion, SL_1: source line, SL_4: source line, 11: display device, 91: driver circuit, 91_1: pulse output circuit, 91_4: pulse output circuit, 92: display unit, 93: driver circuit, 94: pixel circuit, 94B: circuit,

The invention claimed is:

1. A display device comprising:
    a first silicon substrate provided with a driver circuit comprising a first pulse output circuit, a second pulse output circuit, a third pulse output circuit, and a fourth pulse output circuit;
    a second silicon substrate provided with a display unit comprising a first pixel circuit comprising a first source line and a first contact portion electrically connected to the first source line, a second pixel circuit comprising a second source line adjacent to the first source line and a second contact portion electrically connected to the second source line, a third pixel circuit comprising a third source line adjacent to the second source line and a third contact portion electrically connected to the third source line, and a fourth pixel circuit comprising a fourth source line adjacent to the third source line and a fourth contact portion electrically connected to the fourth source line; and
    a connection unit where the first silicon substrate and the second silicon substrate are electrically connected to each other,
    wherein the display unit is placed to overlap with the driver circuit,
    wherein the first pulse output circuit is electrically connected to the first pixel circuit through the first contact portion,
    wherein the second pulse output circuit is electrically connected to the second pixel circuit through the second contact portion,
    wherein the third pulse output circuit is electrically connected to the third pixel circuit through the third contact portion,
    wherein the fourth pulse output circuit is electrically connected to the fourth pixel circuit through the fourth contact portion,
    wherein the first pulse output, circuit and the second pulse output, circuit are placed on different sides with respect to a straight line through the first contact portion and the second contact portion,
    wherein the second pulse output circuit and the third pulse output circuit are placed on different sides with respect to the straight line,
    wherein the third pulse output circuit and the fourth pulse output circuit are placed on different sides with respect to the straight line, and
    wherein the connection unit comprises a wiring comprising copper.

2. A display device comprising:
    a first silicon substrate provided with a driver circuit comprising a first pulse output circuit, a second pulse output circuit, a third pulse output circuit, and a fourth pulse output circuit;
    a second silicon substrate provided with a display unit comprising a first pixel circuit comprising a first source line and a first contact portion electrically connected to the first source line, a second pixel circuit comprising a second source line adjacent to the first source line and a second contact portion electrically connected to the second source line, a third pixel circuit comprising a third source line adjacent to the second source line and a third contact portion electrically connected to the third source line, and a fourth pixel circuit comprising a fourth source line adjacent to the third source line and a fourth contact portion electrically connected to the fourth source line; and
    a connection unit where the first silicon substrate and the second silicon substrate are electrically connected to each other,
    wherein the display unit is placed to overlap with the driver circuit,
    wherein the first pulse output circuit is electrically connected to the first pixel circuit through the first contact portion,
    wherein the second pulse output circuit is electrically connected to the second pixel circuit through the second contact portion,
    wherein the third pulse output circuit is electrically connected to the third pixel circuit through the third contact portion,
    wherein the fourth pulse output circuit is electrically connected to the fourth pixel circuit through the fourth contact portion,
    wherein the first pulse output, circuit and the second pulse output, circuit are placed on different sides with respect to a straight line through the first contact portion and the second contact portion,
    wherein the second pulse output circuit and the third pulse output circuit are placed on different sides with respect to the straight line,
    wherein the third pulse output circuit and the fourth pulse output circuit are placed on different sides with respect to the straight line, and
    wherein the connection unit comprises a conductive bump.

3. The display device according to claim 1, wherein the first pixel circuit comprises a first display element, and
    wherein the first display element is configured to emit visible light or to transmit visible light.

4. The display device according to claim 3, wherein the first pixel circuit further comprises a second display element, and
    wherein the second display element is configured to reflect visible light.

5. The display device according to claim 2, wherein the first pixel circuit comprises a first display element, and
    wherein the first display element is configured to emit visible light or to transmit visible light.

6. The display device according to claim 5, wherein the first pixel circuit further comprises a second display element, and
    wherein the second display element is configured to reflect visible light.

* * * * *